(12) United States Patent
Kwag et al.

(10) Patent No.: US 11,916,178 B2
(45) Date of Patent: Feb. 27, 2024

(54) DISPLAY DEVICE

(71) Applicant: Samsung Display Co., LTD., Yongin-si (KR)

(72) Inventors: Jin Oh Kwag, Suwon-si (KR); Dae Hyun Kim, Hwaseong-si (KR); Keun Kyu Song, Seongnam-si (KR); Sung Chan Jo, Seoul (KR); Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 455 days.

(21) Appl. No.: 17/297,326

(22) PCT Filed: Aug. 23, 2019

(86) PCT No.: PCT/KR2019/010728
§ 371 (c)(1),
(2) Date: May 26, 2021

(87) PCT Pub. No.: WO2020/111453
PCT Pub. Date: Jun. 4, 2020

(65) Prior Publication Data
US 2022/0037568 A1   Feb. 3, 2022

(30) Foreign Application Priority Data

Nov. 27, 2018  (KR) .................. 10-2018-0148382

(51) Int. Cl.
*H01L 33/58*     (2010.01)
*H01L 27/15*     (2006.01)
(Continued)

(52) U.S. Cl.
CPC ............ *H01L 33/58* (2013.01); *H01L 27/156* (2013.01); *H01L 33/382* (2013.01); *H01L 33/50* (2013.01)

(58) Field of Classification Search
CPC ....... H01L 33/58; H01L 33/382; H01L 33/50; H01L 27/156
See application file for complete search history.

(56) References Cited

U.S. PATENT DOCUMENTS 8,872,214 B2   10/2014  Negishi et al.
9,112,112 B2    8/2015  Do et al.
(Continued)

FOREIGN PATENT DOCUMENTS

JP   2017-227858   12/2017
KR  10-2008-0016428   2/2008
(Continued)

OTHER PUBLICATIONS

Extended European Search Report, corresponding to European Application No./Patent No. 19890717.2, dated Jul. 27, 2022.

*Primary Examiner* — Marc Anthony Armand
(74) *Attorney, Agent, or Firm* — KILE PARK REED & HOUTTEMAN PLLC

(57) ABSTRACT

A display device includes a first electrode and a second electrode that are spaced apart from and facing each other; a light-blocking layer disposed above the first electrode and the second electrode; and at least one light-emitting element disposed between the first electrode and the second electrode. The light-blocking layer includes a light-blocking portion absorbing light and an opening pattern. The light-blocking portion includes an area partially overlapping the first electrode and the second electrode. The at least one opening pattern exposes portions of the first and second electrodes facing each other and at least a portion of an area between the first and second electrodes facing each other. The at least one light-emitting element overlaps the at least one opening pattern.

20 Claims, 33 Drawing Sheets

(51) Int. Cl.
    *H01L 33/38*         (2010.01)
    *H01L 33/50*         (2010.01)

(56) References Cited

U.S. PATENT DOCUMENTS

| | | | |
|---|---|---|---|
| 10,134,709 | B1 | 11/2018 | Wu et al. |
| 11,710,760 | B2 * | 7/2023 | Kusunoki ............. H01L 27/153 |
| | | | 257/43 |
| 2011/0089850 | A1 | 4/2011 | Shibata et al. |
| 2017/0263828 | A1 | 9/2017 | Mao et al. |
| 2018/0012876 | A1 | 1/2018 | Kim et al. |
| 2018/0138162 | A1 | 5/2018 | Takeya et al. |
| 2021/0280753 | A1 | 9/2021 | Kim et al. |
| 2021/0288220 | A1 | 9/2021 | Oh et al. |
| 2023/0217711 | A1 * | 7/2023 | Lin .................. H10K 59/80522 |
| | | | 257/71 |

FOREIGN PATENT DOCUMENTS

| | | |
|---|---|---|
| KR | 10-2012-0122159 | 11/2012 |
| KR | 10-1209449 | 12/2012 |
| KR | 10-1436123 | 11/2014 |
| KR | 10-2015-0006798 | 1/2015 |
| KR | 10-2016-0059569 | 5/2016 |
| KR | 10-2016-0059574 | 5/2016 |
| KR | 10-1711187 | 3/2017 |
| KR | 10-2017-0057818 | 5/2017 |
| KR | 10-2017-0101334 | 9/2017 |
| KR | 10-1842585 | 3/2018 |
| KR | 10-2018-0061802 | 6/2018 |
| KR | 10-2018-0071465 | 6/2018 |
| KR | 10-2018-0081378 | 7/2018 |
| KR | 10-2019-0124359 | 11/2019 |

\* cited by examiner

800_7: 810_7, 820_7, 830_7

800_8: 810_8, 820_8, 830_8

700:710,720,730,750,780

DISPLAY DEVICE

CROSS-REFERENCE TO RELATED APPLICATIONS

This application is a national entry of International Application No. PCT/KR2019/010728, filed on Aug. 23, 2019, which claims under 35 U.S.C. §§ 119(a) and 365(b) priority to and benefits of Korean Patent Application No. 10-2018-0148382, filed on Nov. 27, 2018 in the Korean Intellectual Property Office (KIPO), the entire contents of which are incorporated herein by reference.

BACKGROUND

1. Technical Field

The disclosure relates to a display device, and more particularly, to a display device including a light-blocking layer for preventing external light from being reflected by an electrode.

2. Description of Related Art

The importance of display devices is increasing along with the development of multimedia. Accordingly, various types of display devices, such as organic light-emitting diode (OLED) displays and liquid crystal displays (LCDs), are being used.

Display devices are devices that display an image and include a display panel such as an organic light-emitting display panel or a liquid crystal display panel. Among these, the display device may include light-emitting elements as a light-emitting display panel. For example, a light-emitting diode (LED) may include an OLED that uses an organic material as a fluorescent material, an inorganic light-emitting diode that uses an inorganic material as a fluorescent material, or the like.

The inorganic light-emitting diode using an inorganic semiconductor as a fluorescent material has durability even in a high temperature environment and has high blue light efficiency as compared with the OLED. Even in a manufacturing process pointed out as a limitation of the conventional inorganic light-emitting diode element, a transfer method using a dielectrophoresis (DEP) method has been developed. Accordingly, research is continuously conducted on an inorganic light-emitting diode having excellent (or desirable) durability and efficiency as compared with an OLED.

SUMMARY

Aspects of the disclosure provide a display device including a light-blocking layer for preventing reflection of external light caused by an electrode.

It should be noted that objects of the disclosure are not limited to the above-described objects, and other objects of the disclosure will be apparent to those skilled in the art from the following descriptions.

According to an embodiment of the disclosure, a display device may include a first electrode and a second electrode that are spaced apart from and face each other, a light-blocking layer disposed on the first electrode and the second electrode, and at least one light-emitting element disposed between the first electrode and the second electrode. The light-blocking layer may include a light-blocking portion absorbing light and an at least one opening pattern, the light-blocking portion may include an area partially overlapping the first electrode and the second electrode, the at least one opening pattern may expose portions of the first and second electrodes facing each other and may expose at least a portion of an area between the first and second electrodes facing each other, and the at least one light-emitting element may overlap the opening pattern.

The light-blocking portion may be disposed directly on upper surfaces of the first electrode and the second electrode, the light-blocking portion may include a recessed area that is recessed from each of side surfaces of the first electrode and the second electrode, and the at least one opening pattern may be disposed in the recessed area of the light-blocking portion.

The light-blocking portion may include at least one selected from among chromium oxide ($CrO_x$), a chromium-chromium oxide ($Cr/CrO_x$) mixture, molybdenum oxide ($MoO_x$), a carbon pigment, and a trichromatic pigment of red-green-blue (RGB).

The display device may further include a first insulating layer overlapping at least portions of the first electrode and the second electrode. The light-blocking layer may be disposed on the first insulating layer.

The at least one opening pattern may include a first opening pattern and a second opening pattern spaced apart from each other, and a light-blocking portion bridge may be disposed in a separation area between the first opening pattern and the second opening pattern.

The display device may further include a contact electrode which is disposed on the first insulating layer and partially contacts the at least one light-emitting element. The contact electrode may include a first contact electrode electrically contacting the first electrode and an end portion of the at least one light-emitting element, and a second contact electrode electrically contacting the second electrode and another end portion of the at least one light-emitting element.

The contact electrode may include at least a portion that overlaps the at least one opening pattern.

The at least a portion of the contact electrode may partially overlap the light-blocking portion.

The display device may further include a second insulating layer overlapping the first electrode, the second electrode, and the at least one light-emitting element.

The light-blocking layer may be disposed on the second insulating layer, and the at least one light-emitting element may include a first light-emitting element overlapping the at least one opening pattern and a second light-emitting element overlapping the light-blocking portion.

The light-blocking layer may further include a reflective portion disposed between the second insulating layer and the light-blocking portion.

At least a portion of first light emitted from the first light-emitting element may be emitted through the at least one opening pattern, and at least a portion of second light emitted from the second light-emitting element may be reflected from the reflective portion toward the at least one opening pattern.

The display device may further include a color conversion part disposed on the second insulating layer and converting a wavelength of light incident on the color conversion part. The light incident on the color conversion part may be at least a portion of light emitted from the at least one light-emitting element. The light-blocking layer may be further disposed on the color conversion part.

According to an embodiment of the disclosure, a display device may include a first electrode and a second electrode which extend in a first direction and are spaced apart from each other, a light-blocking layer disposed on the first electrode and the second electrode, and at least one light-emitting element which is disposed between the first electrode and the second electrode and includes end portions that are electrically connected to the first electrode and the second electrode, respectively. The light-blocking layer may include a light-blocking portion absorbing light, and at least one opening pattern including at least a portion that extends in the first direction, at least a partial area of the light-blocking portion may partially overlap the first electrode and the second electrode, the at least one opening pattern may expose portions of the first and second electrodes and may expose at least a portion of an area between the first and second electrodes, and the at least one light-emitting element may overlap the at least one opening pattern.

The display device may further include a first insulating layer overlapping at least portions of the first electrode and the second electrode. The light-blocking layer may be disposed on the first insulating layer.

The light-blocking portion may include at least one selected from among chromium oxide ($CrO_x$), a chromium-chromium oxide ($Cr/CrO_x$) mixture, molybdenum oxide ($MoO_x$), a carbon pigment, and a trichromatic pigment of red-green-blue (RGB).

The at least one opening pattern may include a first opening pattern and a second opening pattern which extend in a first direction, and the first opening pattern and the second opening pattern may each have a width greater than an interval between the first electrode and the second electrode.

The light-blocking portion may include a light-blocking portion bridge disposed between the first opening pattern and the second opening pattern spaced apart from each other.

The first opening pattern and the second opening pattern may be spaced apart from each other in the first direction, and the light-blocking portion bridge may extend in a second direction different from the first direction.

The first opening pattern and the second opening pattern may be spaced apart from each other in a third direction different from the first direction, and the light-blocking portion bridge may extend in the first direction.

Other details of embodiments for solving the above problems are included in the detailed description and the drawings.

A display device according to one embodiment includes a light-blocking layer disposed in a non-emission area of each pixel and overlapping at least a portion of each electrode. The light-blocking layer absorbs external light incident on the electrode, thereby reducing the reflection of the external light by the electrode. A light-blocking layer according to another embodiment further includes a reflective layer thereunder, thereby reflecting light emitted from a non-emission area to an emission area.

Accordingly, the display device can reduce the reflection of the external light and can concentrate light emitted from an inorganic light-emitting diode to the emission area, thereby improving light efficiency per unit pixel.

Effects of the disclosure are not limited to the embodiments set forth herein and more diverse effects are included in this specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as being limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
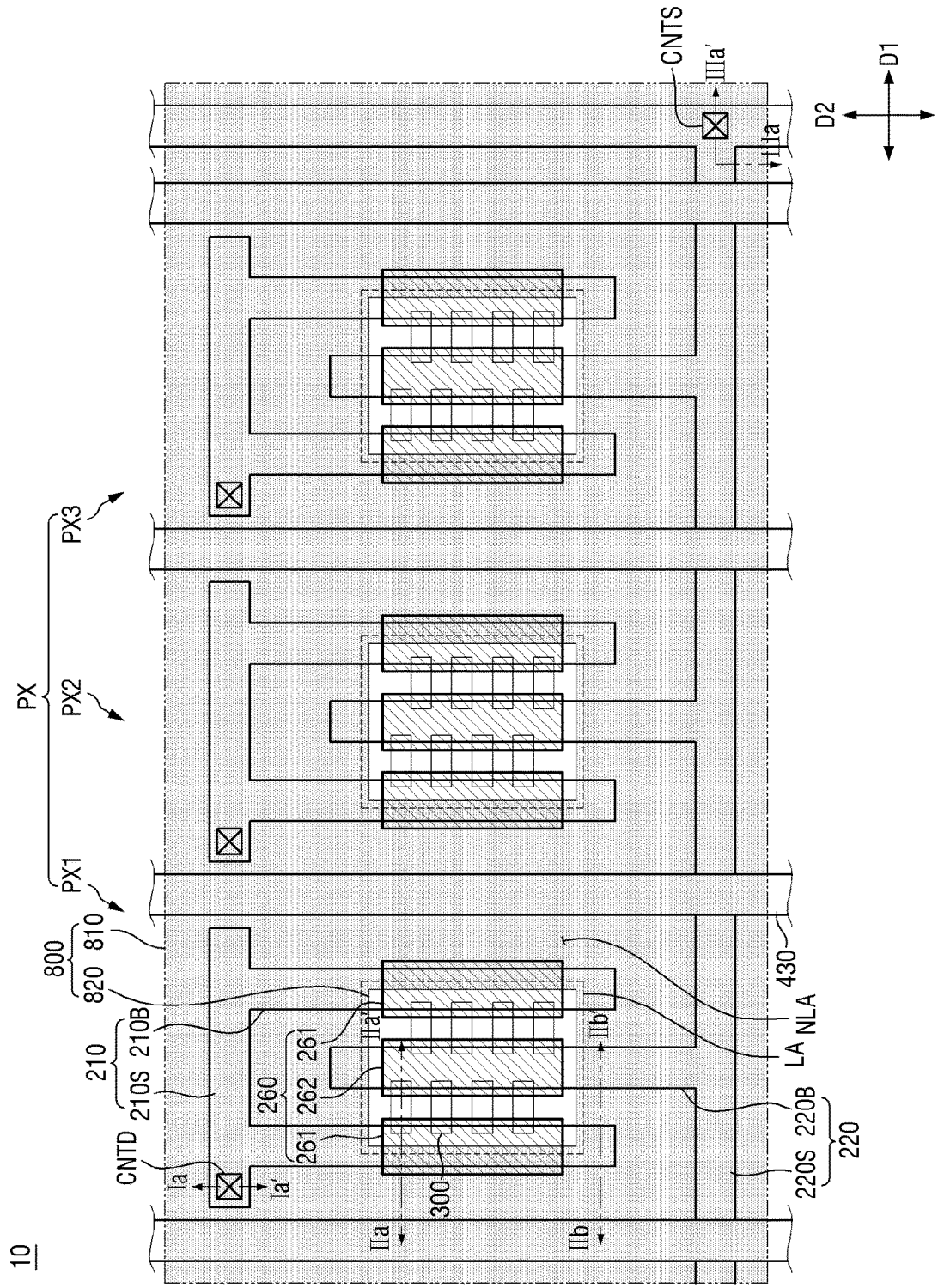
FIG. 1 is a schematic plan view of a display device according to an embodiment.

FIG. 1 is a schematic plan view of a display device according to an embodiment.

Referring to FIG. 1, a display device 10 may include pixels PX. Each of the pixels PX may include one or more light-emitting elements (or light-emitting diodes) 300 configured to emit light having a specific wavelength, thereby displaying a specific color.

Each of the pixels PX may include a first subpixel PX1, a second subpixel PX2, and a third subpixel PX3. The first subpixel PX1 may emit light having a first color, the second subpixel PX2 may emit light having a second color, and the third subpixel PX3 may emit light having a third color. The first color may be a red color, the second color may be a green color, and the third color may be a blue color, but the disclosure is not limited thereto. In some embodiments, the subpixels PXn (where n is a natural number) may emit light having the same color. Although FIG. 1 illustrates that each of the pixels PX includes three subpixels (e.g., the first to third subpixels PX1 to PX3), the disclosure is not limited thereto, and each of the pixels PX may include four or more subpixels.

Each of the subpixels PXn of the display device 10 may include areas defined as an emission area (or light emission area) LA and a non-emission area NLA. The emission area LA may be defined as an area in which the light-emitting element 300 included in the display device 10 is disposed to emit light having a specific wavelength. The non-emission area NLA may be defined as an area, in which a light-blocking layer 800 described below is disposed, other than the emission area LA.

The display device 10 according to an embodiment may include the light-blocking layer 800 disposed on electrodes 210 and 220 disposed in each pixel PX or subpixel PXn. The light-blocking layer 800 may absorb external incident light to prevent the light from being reflected by the electrodes 210 and 220 and emitted to the outside. The light-blocking layer 800 may be disposed in an area other than the emission area LA in which light emitted from the light-emitting element 300 is displayed. For example, the emission area LA of each pixel PX or subpixel PXn may be understood as an area in which the light-blocking layer 800 is not disposed, and the non-emission area NLA thereof may be understood as an area in which the light-blocking layer 800 is disposed. More detailed descriptions will be given below.

The subpixel PXn of the display device 10 may include banks 400, the electrodes 210 and 220, the light-emitting elements 300, and the light-blocking layer 800 disposed in at least a partial area of the subpixel PXn.

The electrodes 210 and 220 may be electrically connected to the light-emitting elements 300 and may receive a predetermined voltage such that the light-emitting elements 300 emit light. At least a portion of each of the electrodes 210 and 220 may be used to form an electric field in the subpixel PXn in order to align the light-emitting elements 300.

Describing the electrodes 210 and 220 in detail with reference to FIG. 1, the electrodes 210 and 220 may include a first electrode 210 and a second electrode 220. In an embodiment, the first electrode 210 may be a pixel electrode separated for each subpixel PXn, and the second electrode 220 may be a common electrode electrically connected in common along each subpixel PXn. One of the first electrode 210 and the second electrode 220 may be an anode of the light-emitting element 300, and the other thereof may be a cathode of the light-emitting element 300. However, the disclosure is not limited thereto, and the reverse may be the case.

The first electrode 210 and the second electrode 220 may include electrode stem portions 210S and 220S which extend in a first direction D1 and one or more electrode branch portions 210B and 220B which are branched off from the electrode stem portions 210S and 220S to extend in a second direction D2 that is a direction intersecting the first direction D1, respectively.

The first electrode 210 may include a first electrode stem portion 210S which extends in the first direction D1 and one or more first electrode branch portions 210B which are branched off from the first electrode stem portion 210S to extend in the second direction D2.

The first electrode stem portion 210S of a pixel PX and the first electrode stem portion 210S of an adjacent subpixel which is in a row identical to that of the pixel PX (for example, which is adjacent thereto in the first direction D1) may be substantially disposed on a same straight line. In other words, both ends of the first electrode stem portion 210S of a pixel PX may be spaced apart from the subpixels PXn and terminated between the subpixels PXn, and the first electrode stem portion 210S of an adjacent pixel PX may be aligned on an extended line of the first electrode stem portion 210S of the pixel PX. Accordingly, the first electrode stem portion 210S disposed in each subpixel PXn may apply different electrical signals to the first electrode branch portions 210B, and each of the first electrode branch portions 210B may be separately driven.

The first electrode branch portion 210B may be branched off from at least a portion of the first electrode stem portion 210S, may extend in the second direction D2, and may be terminated and spaced apart from the second electrode stem portion 220S disposed opposite to the first electrode stem portion 210S.

The second electrode 220 may include a second electrode stem portion 220S which extends in the first direction D1 and is spaced apart from and face the first electrode stem portion 210S and a second electrode branch portion 220B which is branched off from the second electrode stem portion 220S and extends in the second direction D2. However, another end of the second electrode stem portion 220S may extend to the adjacent subpixels PXn in the first direction D1. Therefore, both ends of the second electrode stem portion 220S of a pixel may be electrically connected to or integral with ends of the second electrode stem portions 220S of adjacent pixels PX between the pixels PX.

The second electrode branch portion 220B may be spaced apart from and face the first electrode branch portion 210B and may be terminated and spaced apart from the first electrode stem portion 210S. For example, an end of the second electrode branch portion 220B may be electrically connected to or integral with the second electrode stem portion 220S, and another end thereof may be disposed in the subpixel PXn and spaced apart from the first electrode stem portion 210S.

One or more first electrode branch portions 210B may be disposed in each subpixel PXn. FIG. 1 illustrates that two first electrode branch portions 210B are provided and the second electrode branch portion 220B is disposed therebetween, but the disclosure is not limited thereto. More first electrode branch portions 210B may be provided, or one first electrode branch portion 210B and two second electrode branch portions 220B may be provided. In some embodiments, the second electrode branch portion 220B may be disposed between the first electrode branch portions 210B, and thus, each subpixel PXn may have a symmetrical structure with respect to the second electrode branch portion 220B. However, the disclosure is not limited thereto.

The banks 400 may include a third bank 430 disposed at a boundary between the subpixels PXn, and a first bank 410 and a second bank 420 which are disposed below the electrodes 210 and 220, respectively. FIG. 1 illustrates only the first electrode 210 and second electrode 220, but does not illustrate the first bank 410 and the second bank 420. However, in each subpixel PXn, the first bank 410 and the second bank 420 having a shape substantially identical to that of the first electrode branch portion 210B and the second electrode branch portion 220B may be provided. For example, it may be understood that the first electrode branch portion 210B and the second electrode branch portion 220B are disposed on the first bank 410 and the second bank 420, respectively.

The third bank 430 may be disposed at a boundary between the first subpixel PX1 and the second subpixel PX2 and at a boundary between the second subpixel PX2 and the third subpixel PX3. Ends of first electrode stem portions 210S may be spaced apart from each other and terminated with respect to the third bank 430. The third bank 430 may extend in the second direction D2 and may be disposed at the boundary between the subpixels PXn arranged in the first direction D1. However, the disclosure is not limited thereto, and the third bank 430 may extend in the first direction D1 and may be disposed at the boundary between the subpixels PXn arranged in the second direction D2. For example, the subpixels PXn may be separated from each other with respect to the third bank 430. The third bank 430 and the first and second banks 410 may include the same material and thus may be formed by substantially the same process. The banks 400 will be described in more detail below with reference to other drawings.

Although not shown in FIG. 1, a first insulating layer 510 may be disposed in each subpixel PXn to entirely cover or overlap the subpixel PXn including the first electrode branch portion 210B and the second electrode branch portion 220B. The first insulating layer 510 may protect each of the electrodes 210 and 220 and insulate the electrodes 210 and 220 from each other such that the electrodes 210 and 220 do not contact each other.

The light-blocking layer 800 may be disposed on each of the electrodes 210 and 220. The light-blocking layer 800 may entirely cover or overlap the subpixel PXn or each of the electrodes 210 and 220 and may partially expose the first electrode branch portion 210B and the second electrode branch portion 220B. The light-blocking layer 800 may be disposed on the first insulating layer 510 to overlap each of the electrodes 210 and 220, but the disclosure is not limited thereto. In some embodiments, the light-blocking layer 800 may directly contact each of the electrodes 210 and 220 or may be disposed on a passivation layer 550 (see FIG. 5) described below.

The light-blocking layer 800 may include a light-blocking portion 810 partially overlapping each of the electrodes 210 and 220 and an opening pattern 820 exposing at least partial areas of the electrodes 210 and 220. The light-blocking portion 810 may be substantially entirely disposed on the subpixel PXn, and the opening pattern 820 may be formed in an area in which the light-blocking portion 810 is not disposed. However, the arrangement and shape of the light-blocking portion 810 are not limited thereto as long as the light-blocking portion 810 may reduce the reflection of external light caused by the electrodes 210 and 220. In some embodiments, the light-blocking portion 810 may overlap only each of the electrodes 210 and 220, and a separate opening pattern 820 may not be formed in the light-blocking layer 800.

The light-blocking portion 810 of the light-blocking layer 800 may include a material that absorbs incident light and may absorb external light incident on the display device 10. The electrodes 210 and 220 of the display device 10 may include a material having high reflectance, and external light incident on the display device 10 may be reflected by the electrodes 210 and 220 and emitted from the display device 10 to the outside. The reflection of external light by the display device 10 may reduce the visibility of light emitted from the light-emitting element 300. In order to prevent the reflection of external light, the display device 10 according to an embodiment may include the light-blocking portion 810 which partially overlaps the electrodes 210 and 220, thereby reducing the reflection of external light by the display device 10. More detailed descriptions thereof will be given below.

The opening pattern 820 may expose a portion of each of the electrodes 210 and 220, for example, a portion of the first electrode branch portion 210B and a portion of the second electrode branch portion 220B. The position at which the opening pattern 820 is formed is not particularly limited. In the drawing, the opening pattern 820 is illustrated as being positioned adjacent to a central portion of each subpixel PXn, but in some embodiments, the opening pattern 820 may be positioned adjacent to an upper or lower side of the subpixel PXn.

In the drawing, the opening pattern 820 is illustrated as having two short sides parallel to each other and meeting other sides at an angle, but the disclosure is not limited thereto. More opening patterns 820 may be formed on the light-blocking layer 800 and may have various shapes.

The opening pattern 820 may provide a path through which light emitted from the light-emitting element 300 and reflected by the electrodes 210 and 220 travels to the outside of the display device 10. The light-emitting element 300 may be disposed between the first electrode branch portion 210B and the second electrode branch portion 220B which are exposed by the opening pattern 820. Light emitted from the light-emitting element 300 may not be blocked by the light-blocking portion 810 and may be emitted to the outside of the display device 10. For example, it may be understood that the emission area LA of each subpixel PXn is an area in which the opening pattern 820 of the light-blocking layer 800 is disposed and through which light emitted from the light-emitting element 300 travels, and that the non-emission area NLA is an area in which the light is blocked by the light-blocking portion 810.

The light-emitting elements 300 may be aligned between the first electrode branch portion 210B and the second electrode branch portion 220B. In at least some of the light-emitting elements 300, an end portion thereof may be electrically connected to the first electrode branch portion 210B, and another end portion thereof may be electrically connected to the second electrode branch portion 220B.

The light-emitting elements 300 may be spaced apart from each other in the second direction D2 and may be aligned substantially parallel to each other. A distance between the light-emitting elements 300 is not particularly limited. In some embodiments, light-emitting elements 300 may be disposed adjacent to each other to form a group, and other light-emitting elements 300 may form a group and be spaced apart from each other at predetermined intervals and may be oriented and aligned in a direction with non-uniform density.

According to an embodiment, at least some of the light-emitting elements 300 may be disposed in an area in which the opening pattern 820 of the light-blocking layer 800 is positioned. An area in which the light-emitting elements 300 are disposed may be an area on the electrodes 210 and 220, in which the opening pattern 820 is positioned and the light-blocking portion 810 is not positioned. Accordingly, the emission area LA in which the light-emitting element 300 is disposed to emit predetermined light, and the non-emission area NLA may be separated from each other according to the positions of the opening pattern 820 and the light-blocking portion 810 of the light-blocking layer 800.

However, the disclosure is not limited thereto, and in some embodiments, the light-emitting element 300 may be disposed on the electrodes 210 and 220 on which the light-blocking portion 810 of the light-blocking layer 800 is disposed. The light-blocking portion 810 may be disposed to partially cover or overlap the electrodes 210 and 220 and thus may expose partial areas of the electrodes 210 and 220, for example, side surfaces thereof. Light emitted from the light-emitting element 300 may be reflected to the outside of the display device 10 through the side surfaces, and external incident light may be absorbed by the light-blocking portion 810 covering (or overlapping) the electrodes 210 and 220.

A contact electrode 260 may be disposed on each of the first electrode branch portion 210B and the second electrode branch portion 220B. However, the contact electrode 260 may be substantially disposed on the first insulating layer 510 and may overlap the first electrode branch portion 210B and the second electrode branch portion 220B.

Contact electrodes 260 may extend in the second direction D2 and may be spaced apart from each other in the first direction D1. The contact electrode 260 may electrically contact at least an end portion of the light-emitting element 300. The contact electrode 260 may electrically contact the first electrode 210 or the second electrode 220 to receive an electrical signal. Accordingly, the contact electrode 260 may transmit an electrical signal transmitted from each of the electrodes 210 and 220 to the light-emitting element 300.

The contact electrode 260 may include a first contact electrode 261 and a second contact electrode 262 which respectively and partially cover or overlap the electrode branch portions 210B and 220B and electrically contact an end portion or another end portion of the light-emitting element 300.

The first contact electrode 261 may be disposed on the first electrode branch portion 210B and may electrically contact an end portion of the light-emitting element 300 so that the end portion may be electrically connected to the first electrode 210. The second contact electrode 262 may be disposed on the second electrode branch portion 220B and may electrically contact another end portion of the light-emitting element 300 so that the other end portion may be electrically connected to the second electrode 220.

As shown in the drawing, since the light-emitting element 300 is disposed in the area in which the opening pattern 820 is positioned on the electrodes 210 and 220, the contact electrode 260 may also be disposed in the area in which the opening pattern 820 is positioned. However, the contact electrode 260 may extend to an area overlapping the light-blocking portion 810 on the first electrode branch portion 210B and the second electrode branch portion 220B to overlap the light-blocking portion 810. For example, the contact electrode 260 may be disposed in an area in which the opening pattern 820 is positioned and may overlap the light-blocking portion 810. However, the disclosure is not limited thereto, and in some embodiments, the contact electrode 260 may not overlap the light-blocking portion 810. This will be described in detail below with reference to other embodiments.

The first electrode stem portion 210S and the second electrode stem portion 220S may be electrically connected to a first transistor 120 or a power line 161 described below through contact holes, for example, a first electrode contact hole CNTD and a second electrode contact hole CNTS, respectively. In the drawing, a second electrode contact hole CNTS is illustrated as being formed in the second electrode stem portion 220S of the subpixels PXn. However, the disclosure is not limited thereto, and in some embodiments, the second electrode contact hole CNTD may be formed for each subpixel PXn.

Although not shown in FIG. 1, the display device 10 may include a second insulating layer 520 (see FIG. 3) and the passivation layer 550 (see FIG. 5) which cover or overlap each of the electrodes 210 and 220 and at least a portion of the light-emitting element 300. The arrangement and structure thereof will be described below with reference to FIG. 3.

As described above, the light-blocking portion 810 may include a material that absorbs external incident light. According to an embodiment, the light-blocking portion 810 may include chromium oxide ($CrO_x$), a chromium-chromium oxide ($Cr/CrO_x$) mixture, molybdenum oxide ($MoO_x$), a carbon pigment, a trichromatic pigment of red-green-blue (RGB), or the like. However, the disclosure is not limited thereto.

As will be described below, each of the electrodes 210 and 220 may include a material having high reflectance in order to reflect light emitted from the light-emitting element 300 to the outside or reflect the light in an upward direction of each of the electrodes 210 and 220. In addition to the light emitted from the light-emitting element 300, external light incident on the display device 10 may be reflected by the electrodes 210 and 220. External light, which is incident and reflected thereby (for example, reflected external light), may be visible to a user of the display device 10 to reduce the visibility of light emitted from the display device 10. Accordingly, the display device 10 according to an embodiment may include the light-blocking layer 800 partially overlapping the electrodes 210 and 220, thereby preventing the reflection of external incident light.

Figure 2:
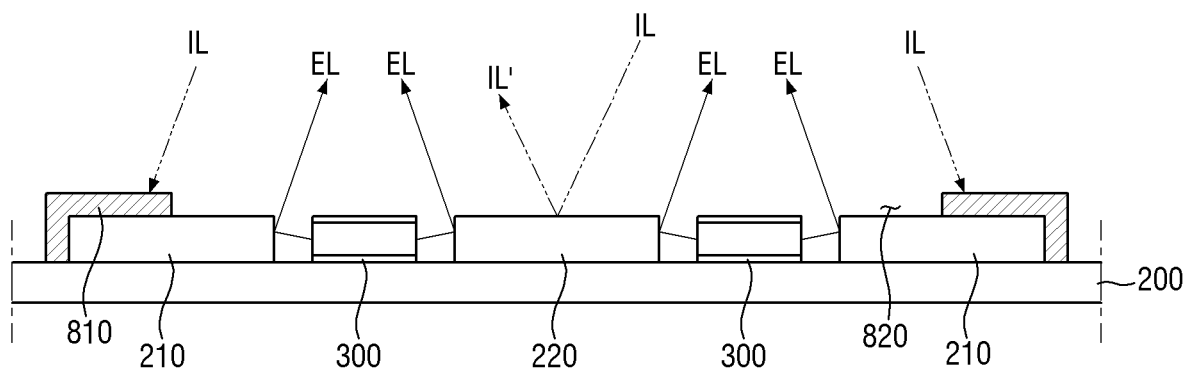
FIG. 2 is a schematic cross-sectional view illustrating a cross section of the display device according to an embodiment.

FIG. 2 is a schematic view illustrating a cross section of the display device according to an embodiment.

As described above, the display device 10 according to an embodiment may include the light-blocking layer 800 disposed on the electrodes 210 and 220, and the light-blocking layer 800 may include the light-blocking portion 810 partially overlap each of the electrodes 210 and 220 and the opening pattern 820 in which the light-blocking portion 810 is not disposed. FIG. 2 may be understood as illustrating a cross section taken in a direction of an area in which the opening pattern 820 is positioned and an area in which the light-blocking portion 810 is positioned in the display device 10.

Referring to FIG. 2, the light-emitting element 300 may be disposed between the first electrode 210 and the second electrode 220, and emission light EL emitted from the light-emitting element 300 may be reflected by the electrodes 210 and 220. The electrodes 210 and 220 may include a material having high reflectance, and the emission light EL incident on partial areas of the electrodes 210 and 220, for example, as shown in the drawing, the side surfaces of the electrodes 210 and 220, may be reflected in an upward direction of the electrodes 210 and 220. The emission light EL reflected by the electrodes 210 and 220 may be visible or visually recognized outside the display device 10.

However, as shown in the drawing, incident light IL from the outside of the display device 10 may also be incident toward the electrodes 210 and 220. The incident light IL directed toward upper surfaces of the electrodes 210 and 220 may be reflected and emitted to the outside of the display device 10 (see IL' of FIG. 2). Since the emission light EL and the reflected incident light IL' are simultaneously visible outside the display device 10, the visibility of the emission light EL emitted from each subpixel PXn may be reduced.

The display device 10 according to an embodiment may include the light-blocking portion 810 overlapping at least portions of the electrodes 210 and 220, and the light-blocking portion 810 may absorb the external incident light IL incident toward the electrodes 210 and 220. Since the light-blocking portion 810 is not disposed on side surfaces of the electrodes 210 and 220, at which the light-emitting element 300 is disposed, the emission light EL emitted from the light-emitting element 300 may be reflected in an upward direction of the electrodes 210 and 220. In contrast, since the light-blocking portion 810 is disposed on other side surfaces opposite to the side surfaces of the electrodes 210 and 220, the incident light IL incident on the other side surfaces may be absorbed by the light-blocking portion 810. Accordingly, an amount of the incident light IL' reflected by the electrodes 210 and 220 can be reduced, and the visibility of the emission light EL emitted from the light-emitting element 300 can be improved.

The drawing illustrates a state in which the light-emitting element 300 is disposed in each of an area in which the light-blocking layer 800 is not disposed and an area in which the light-blocking layer 800 is disposed. In some embodiments, the light-emitting element 300 may be disposed on the electrodes 210 and 220 on which the light-blocking portion 810 is disposed in an entire area of the pixel PX or the subpixel PXn.

However, as described above, the pixel PX or the subpixel PXn of the display device 10 may be separated into an area in which the light-blocking portion 810 is disposed and an area in which the opening pattern 820 is disposed, and the light-emitting element 300 may be disposed only in the area in which the opening pattern 820 is disposed. An area in which the light-blocking portion 810 overlaps the electrodes 210 and 220 may be an area in which the incident light IL is absorbed, and an area in which the opening pattern 820 overlaps the electrodes 210 and 220 may be an area from which the emission light EL and the reflected incident light IL' are emitted at the same time.

In the display device 10 according to an embodiment, the opening pattern 820 may be formed in an area necessary to emit an amount of light required for each subpixel PXn, and the light-blocking portion 810 may be disposed only in an unnecessary area other than the necessary area. For example, in the display device 10, the light-blocking portion 810 may be disposed in an area other than a partial area of the pixel PX or subpixel PXn, thereby minimizing or reducing the reflection of external light by the display device 10 to improve the visibility of the emission light EL.

The display device 10 may further include a circuit element layer positioned under each of the electrodes 210 and 220 shown in FIG. 1. Hereinafter, this will be described in detail with reference to other drawings.

Figure 3:
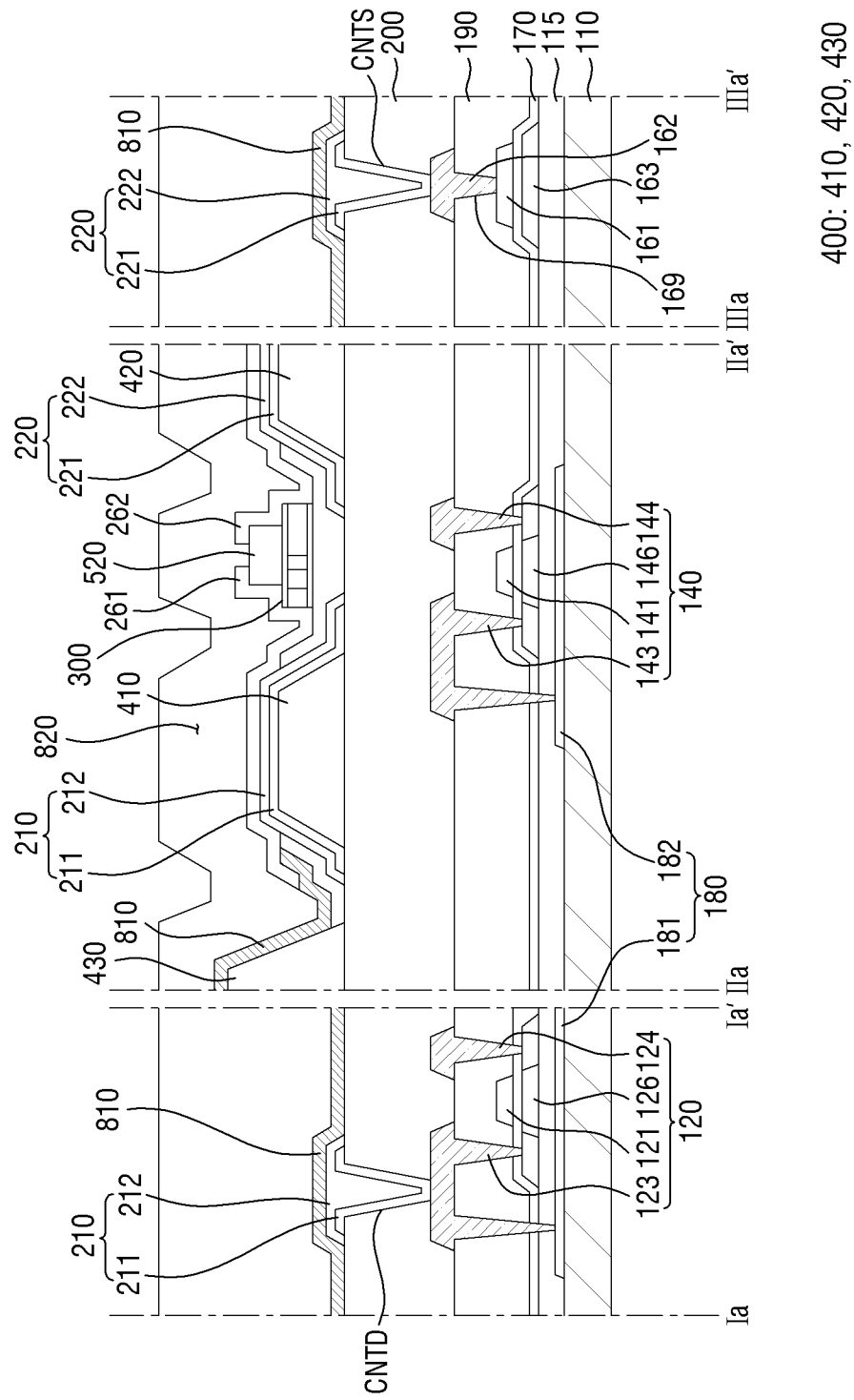
FIG. 3 is a schematic cross-sectional view taken along lines Ia-Ia', IIa-IIa', and IIIa-IIIa' of FIG. 1.
Figure 4:
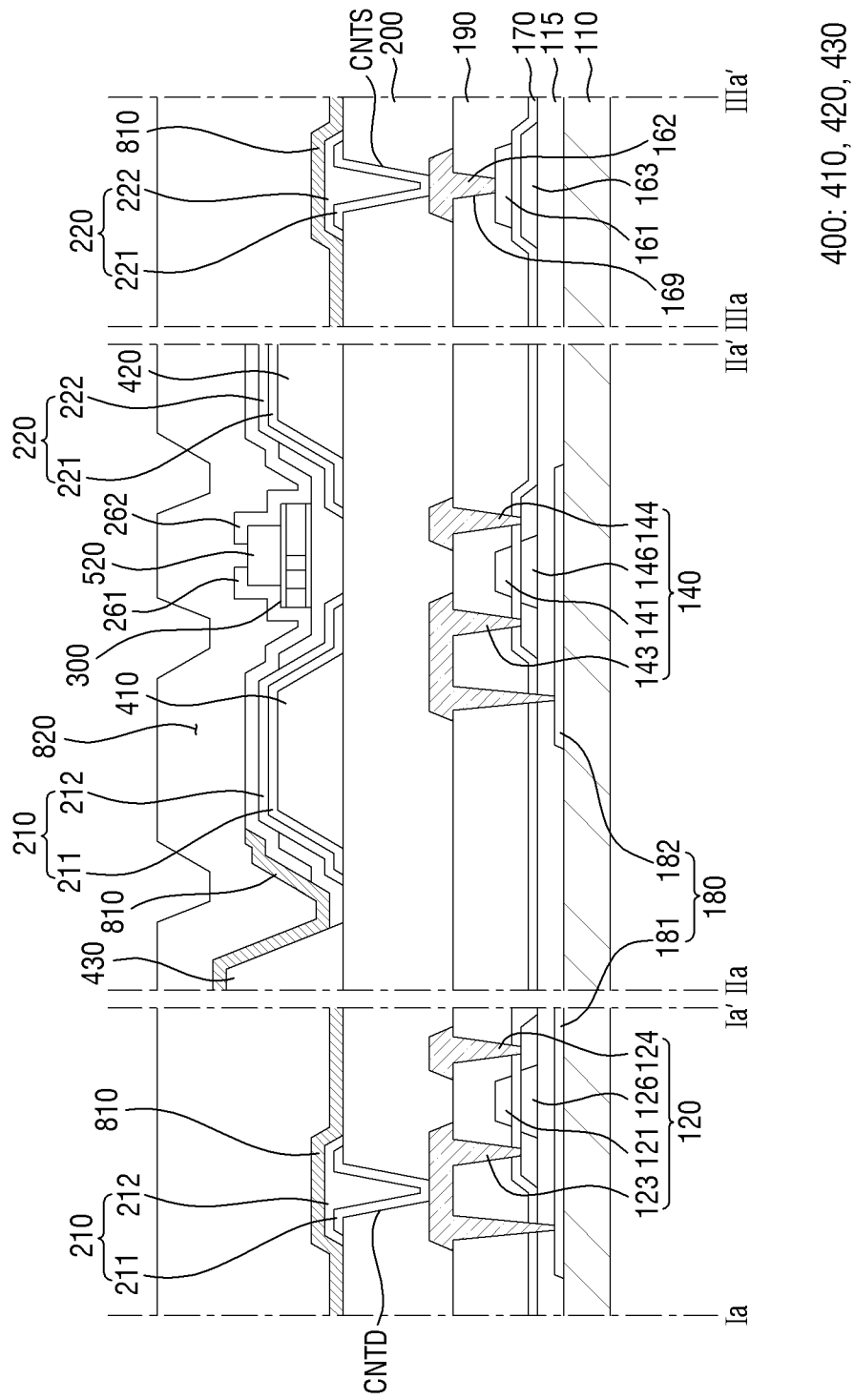
FIG. 4 is a schematic cross-sectional view according to another embodiment of FIG. 3.
Figure 5:
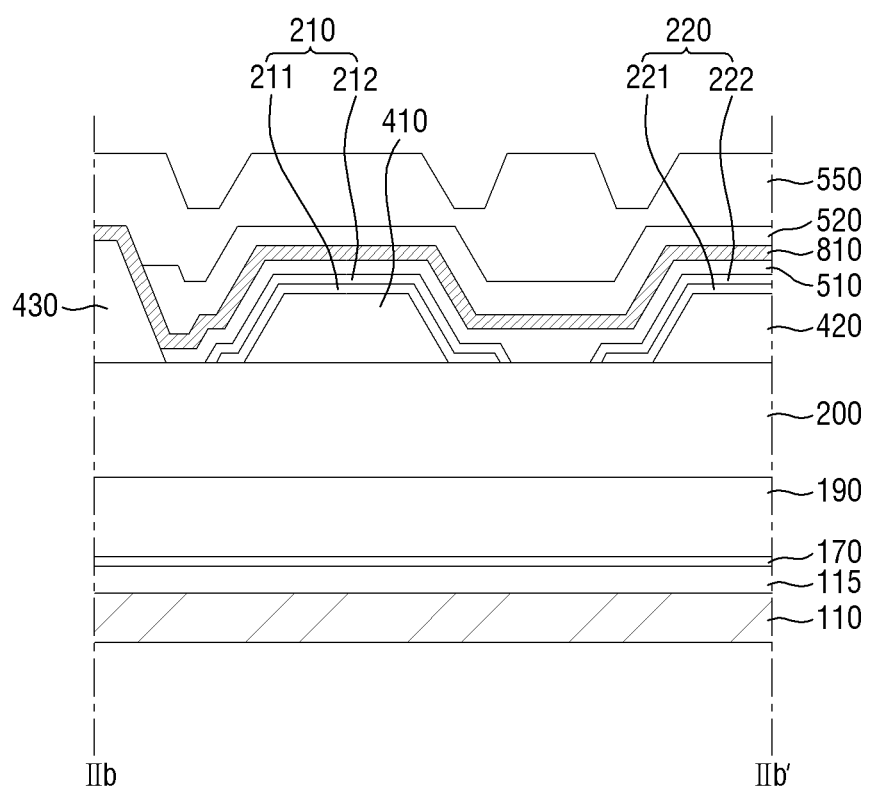
FIG. 5 is a schematic cross-sectional view taken along line IIb-IIb' of FIG. 1.

FIG. 3 is a schematic cross-sectional view taken along lines Ia-Ia', IIa-IIa', and IIIa-IIIa' of FIG. 1. FIG. 4 is a schematic cross-sectional view according to an embodiment of FIG. 3. FIG. 5 is a schematic cross-sectional view taken along line IIb-IIb' of FIG. 1. FIGS. 3 to 5 illustrate only a schematic cross-sectional view of the first subpixel PX1, but the same may be applied to other pixels PX or subpixels PXn. FIG. 3 illustrates a schematic cross section traversing an end and another end of a light-emitting element 300.

Referring to FIGS. 1 and 3, the display device 10 may include a substrate 110, a buffer layer 115, a bridge pattern 180 including first and second bridge patterns 181 and 182, first and second transistors 120 and 140, the electrodes 210 and 220 disposed on the first and second transistors 120 and 140, and the light-emitting element 300.

The substrate 110 may be an insulating substrate. The substrate 110 may be made of (or include) an insulating material such as glass, quartz, or a polymer resin. The substrate 110 may be a rigid substrate or a flexible substrate which is bendable, foldable, and rollable.

The first and second bridge patterns 181 and 182 may be disposed on the substrate 110. The first bridge pattern 181 may be electrically connected to a first drain electrode 123 of the first transistor 120 described below. The second bridge pattern 182 may be electrically connected to a second drain electrode 143 of the second transistor 140.

The first bridge pattern 181 and the second bridge pattern 182 may overlap a first active layer 126 of the first transistor 120 and a second active layer 146 of the second transistor 140, respectively. The first and second bridge patterns 181 and 182 may include a light-blocking material to prevent light from being incident on the first and second active layers 126 and 146. As an example, the first and second bridge patterns 181 and 182 may be made of an opaque metallic material that blocks light transmission.

The buffer layer 115 may be disposed on the first and second bridge patterns 181 and 182 and the substrate 110. The buffer layer 115 may be disposed to entirely cover or overlap the substrate 110 and the first and second bridge patterns 181 and 182. The buffer layer 115 may prevent the diffusion of impurity ions, prevent the permeation of moisture or ambient air, and perform a surface planarization function. The buffer layer 115 may insulate the first and second bridge patterns 181 and 182 from the first and second active layers 126 and 146.

A semiconductor layer may be disposed on the buffer layer 115. The semiconductor layer may include the first active layer 126 of the first transistor 120, the second active layer 146 of the second transistor 140, and an auxiliary layer 163. The semiconductor layer may include polycrystalline silicon, single crystal silicon, an oxide semiconductor, or the like.

A first gate insulating film 170 may be disposed on the semiconductor layer. The first gate insulating film 170 may entirely cover or overlap the semiconductor layer and the buffer layer 115. The first gate insulating film 170 may function as gate insulating films of the first and second transistors 120 and 140.

A first conductive layer may be disposed on the first gate insulating film 170. The first conductive layer may include a first gate electrode 121 disposed on the first active layer 126 of the first transistor 120, a second gate electrode 141 disposed on the second active layer 146 of the second transistor 140, and the power line 161 disposed on the auxiliary layer 163.

An interlayer insulating film 190 may be disposed on the first conductive layer. The interlayer insulating film 190 may function as an interlayer insulating film. The interlayer insulating film 190 may include an organic insulating material and may perform a surface planarization function.

A second conductive layer may be disposed on the interlayer insulating film 190. The second conductive layer may include the first drain electrode 123 and a first source electrode 124 of the first transistor 120, the second drain electrode 143 and a second source electrode 144 of the second transistor 140, and a power electrode 162 disposed on the power line 161.

The first drain electrode 123 and the first source electrode 124 may be electrically connected to the first active layer 126 through contact holes passing through the interlayer insulating film 190 and the first gate insulating film 170. The second drain electrode 143 and the second source electrode 144 may be electrically connected to the second active layer 146 through contact holes passing through the interlayer insulating film 190 and the first gate insulating film 170. The first drain electrode 123 and the second drain electrode 143 may be electrically connected to the first bridge pattern 181 and the second bridge pattern 182 through other contact holes, respectively.

A via layer 200 may be disposed on the second conductive layer. The via layer 200 may include an organic insulating material to perform a surface planarization function.

The banks 410, 420, and 430 may be disposed on the via layer 200. The banks 410, 420, and 430 may be disposed in each subpixel PXn to be spaced apart from each other. The banks 410, 420, and 430 may include the first and second banks 410 and 420 disposed adjacent to the central portion of the subpixel PXn and the third bank 430 disposed at the boundary between the subpixels PXn.

The third bank 430 may be a bank that defines a boundary of each subpixel PXn. In case that the display device 10 is manufactured, the third bank 430 may block an organic material or a solvent from crossing the boundary of the subpixel PXn in case that the organic material or the solvent is sprayed using an inkjet printing method. As another example, in case that the display device 10 further includes another member, that member may be disposed on the third bank 430, and the third bank 430 may also perform a function of supporting the member. However, the disclosure is not limited thereto.

The first bank 410 and the second bank 420 may be spaced apart from and face each other. The first electrode 210 may be disposed on the first bank 410, and the second electrode 220 may be disposed on the second bank 420. Referring to FIGS. 1 and 3, it may be understood that the first electrode branch portion 210B is disposed on the first bank 410 and the second electrode branch portion 220B is disposed on the second bank 420. For example, the first bank 410 and the second bank 420 may extend in the second direction D2 and may be spaced apart from each other in the first direction D1 with reference to FIG. 1.

FIG. 3 illustrates that a first bank 410, a second partition 420, and a third bank 430 are disposed, but the disclosure is not limited thereto. In case that two first electrode branch portions 210B are disposed in one subpixel PXn as shown in FIG. 1, two first banks 410 and one second bank 420 may be provided, and each subpixel PXn may include more banks 410, 420, and 430.

As described above, the first bank 410, the second bank 420, and the third bank 430 may be formed by substantially the same process. Accordingly, the banks 410, 420, and 430 may form a grid pattern. The banks 410, 420, and 430 may include polyimide (PI).

The banks 410, 420, and 430 may have a structure in which at least a portion thereof protrudes from the via layer 200. The banks 410, 420, and 430 may protrude upward from a planar surface on which the light-emitting element 300 is disposed, and at least a portion of the protruding portion may have an inclination. The shape of the banks 410, 420, and 430 having the protruding structure is not particularly limited. As shown in the drawing, the first bank 410 and the second bank 420 may protrude to have a same height, and the third bank 430 may have a shape protruding to a higher position.

Reflective layers 211 and 221 may be disposed on the first and second banks 410 and 420, respectively, and electrode layers 212 and 222 may be disposed on the reflective layers 211 and 221, respectively. The reflective layers 211 and 221 and the electrode layers 212 and 222 may form (or constitute) the electrodes 210 and 220, respectively.

The reflective layers 211 and 221 may include a first reflective layer 211 and a second reflective layer 221. The first reflective layer 211 may cover or overlap the first bank 410, and a portion thereof may be electrically connected to the first drain electrode 124 through a contact hole passing through the via layer 200. The second reflective layer 221 may cover or overlap the second bank 420, and a portion thereof may be electrically connected to the power electrode 162 through a contact hole 169 passing through the via layer 200. The contact hole through which the first reflective layer 211 is connected may be the first electrode contact hole CNTD of FIG. 1, and the contact hole through which the second reflective layer 221 is connected may be the second electrode contact hole CNTS of FIG. 1.

The reflective layers 211 and 221 may include a material having high reflectance to reflect emission light EL emitted from the light-emitting element 300. As an example, the reflective layers 211 and 221 may include a material such as silver (Ag), copper (Cu), indium tin oxide (ITO), indium zinc oxide (IZO), or indium tin-zinc oxide (ITZO), but the disclosure is not limited thereto.

The electrode layers 212 and 222 may include a first electrode layer 212 and a second electrode layer 222. The electrode layers 212 and 222 and the reflective layers 211 and 221 may have substantially the same patterns. The first reflective layer 211 and the first electrode layer 212 may be spaced apart from the second reflective layer 221 and the second electrode layer 222, respectively.

The electrode layers 212 and 222 may include a transparent conductive material so that the emission light EL emitted from the light-emitting element 300 may be incident on the reflective layers 211 and 221. As an example, the electrode layers 212 and 222 may include a material such as ITO, IZO, or ITZO, but the disclosure is not limited thereto.

In some embodiments, the reflective layers 211 and 221 and the electrode layers 212 and 222 may have a structure in which at least one transparent conductive layer made of ITO, IZO, or ITZO and at least one metal layer made of silver or copper are stacked. As an example, the reflective layers 211 and 221 and the electrode layers 212 and 222 may have a stacked structure of ITO/Ag/ITO/IZO.

The first reflective layer 211 and the first electrode layer 212 may constitute the first electrode 210, and the second reflective layer 221 and the second electrode layer 222 may constitute the second electrode 220. The first electrode 210 and the second electrode 220 may transmit electrical signals transmitted from the first transistor 120 and the power electrode 162 to the light-emitting element 300 through the first electrode layer 212 and the second electrode layer 222, respectively.

In some embodiments, the first electrode 210 and the second electrode 220 may be formed as a layer. For example, the reflective layers 211 and 221 and the electrode layers 212 and 222 are formed as a single-layer to transmit an electrical signal to the light-emitting element 300 and reflect the emission light EL. In an embodiment, the first electrode 210 and the second electrode 220 may include a conductive material having high reflectance. As an example, the first electrode 210 and the second electrode 220 may be made of an alloy including aluminum (Al), nickel (Ni), lanthanum (La), or the like. However, the disclosure is not limited thereto.

The first insulating layer 510 may be disposed on the first electrode 210 and the second electrode 220 to partially cover or overlap the first electrode 210 and the second electrode 220. The first insulating layer 510 may cover or overlap most of upper surfaces of the first electrode 210 and the second electrode 220 and may expose portions of the first electrode 210 and the second electrode 220. The first insulating layer 510 may cover or overlap a space between the first electrode 210 and the second electrode 220 and also partially cover or overlap an area opposite to the space between the first electrode 210 and the second electrode 220.

The first insulating layer 510 may be disposed such that the relatively flat upper surfaces of the first electrode 210 and the second electrode 220 are exposed and may be disposed such that the electrodes 210 and 220 overlap inclined side surfaces of the first bank 410 and the second bank 420. The first insulating layer 510 may have a flat upper surface formed such that the light-emitting element 300 is disposed thereon, and the upper surface may extend in a direction toward the first electrode 210 and the second electrode 220. Such extended portions of the first insulating layer 510 may be terminated at inclined side surfaces of the first electrode 210 and the second electrode 220. Accordingly, the contact electrode 260 described below may electrically contact the exposed first and second electrodes 210 and 220 and may smoothly contact the light-emitting element 300 on the flat upper surface of the first insulating layer 510.

The first insulating layer 510 may protect the first electrode 210 and the second electrode 220 and insulate the first electrode 210 and the second electrode 220 from each other. The first insulating layer 510 may also prevent the light-emitting element 300 disposed on the first insulating layer 510 from being damaged by directly contacting other members.

The light-emitting element 300 or the light-blocking portion 810 of the light-blocking layer 800 may be disposed on the first insulating layer 510.

One or more light-emitting elements 300 may be disposed on the first insulating layer 510 between the first electrode 210 and the second electrode 220. In the light-emitting element 300, layers may be disposed in a horizontal direction on the via layer 200. As will be described below, the light-emitting element 300 may include a first conductivity-type semiconductor 310, an active layer 330, a second conductivity-type semiconductor 320, and an electrode layer 370. In the light-emitting element 300 of the display device 10 according to an embodiment, the layers may be sequentially disposed in the horizontal direction on the via layer 200. However, the disclosure is not limited thereto. The sequence, in which the layers of the light-emitting element 300 are disposed, may be reversed, and in some embodiments, in case that the light-emitting element 300 has another structure, the layers may be disposed in a direction perpendicular to the via layer 200. This will be described below with reference to other drawings.

The light-blocking portion 810 of the light-blocking layer 800 may be disposed on the first insulating layer 510 positioned between the first electrode 210 and the third bank 430. As described above, the light-blocking layer 800 may include the light-blocking portion 810 and the opening pattern 820, and in FIG. 3, an area in which the light-blocking portion 810 is not disposed may be understood as an area in which the opening pattern 820 is positioned. The area may be an area necessary to emit an amount of light required by each subpixel PXn and thus may be the emission area LA of the subpixel PXn.

Similar to the first insulating layer 510, the light-blocking portion 810 may be disposed to overlap the inclined side surface of the first electrode 210 and may extend in a direction to also be disposed on an inclined side surface of the third bank 430. The incident light IL incident from the outside may not be reflected by the first electrode 210 overlapping the light-blocking portion 810 and may be absorbed by the light-blocking portion 810. However, the incident light IL may be reflected in an area in which the light-blocking portion 810 is not disposed and the first electrode 210 or the second electrode 220 is exposed.

The area in which the light-blocking portion 810 is disposed is not limited thereto. The light-blocking portion 810, in the area in which the opening pattern 820 is not formed, may cover or overlap the first electrode 210, the second electrode 220, and the first insulating layer 510. In some embodiments, the light-blocking portion 810 may be disposed on the contact electrode 260 to partially cover the first electrode 210, the second electrode 220, and the first insulating layer 510.

Referring to FIG. 4, the light-blocking layer 800 of the display device 10 according to an embodiment may include the light-blocking portion 810 partially covering or overlapping the contact electrode 260. As shown in FIG. 4, the light-blocking portion 810 of the light-blocking layer 800 may be disposed on the first insulating layer 510 to partially cover or overlap an upper surface of the contact electrode 260. When the display device 10 is manufactured, after the contact electrode 260 is formed, the light-blocking layer 800 may be formed so that the light-blocking portion 810 may be disposed on the upper surface of the contact electrode 260. However, the disclosure is not limited thereto.

Referring to FIG. 5, the first insulating layer 510 may entirely cover or overlap areas of the first electrode 210 and the second electrode 220, and the light-blocking portion 810 may entirely cover or overlap the first insulating layer 510. For example, the light-blocking portion 810 may also be disposed in an area between the first electrode 210 and the third bank 430 and an area between the first electrode 210 and the second electrode 220. In case that an amount of light emitted from the light-emitting element 300 positioned in the emission area LA satisfies an amount of light required to be emitted from the subpixel PXn, the light-blocking portion 810 for minimizing or reducing reflection of external light may be disposed in the non-emission area NLA excluding the emission area LA.

FIG. 3 is a schematic cross-sectional view including the emission area LA in which the opening pattern 820 is positioned, and FIG. 5 is a schematic cross-sectional view of the non-emission area NLA in which the light-blocking portion 810 is positioned. As shown in FIGS. 3 and 5, in case that an amount of light emitted from the light-emitting element 300 disposed in the emission area LA satisfies an amount of light required for each subpixel PXn, the light-emitting element 300 may not be disposed in the non-emission area NLA, which is an area excluding the emission area LA. For example, the light-blocking portion 810 may be entirely disposed on the electrodes 210 and 220 in the non-emission area NLA in which the light-emitting element 300 is not disposed.

However, the disclosure is not limited thereto. In some embodiments, the light-emitting element 300 may be disposed in the non-emission area NLA, and the light-blocking portion 810 may absorb the incident light IL and a portion of the emission light EL. For detailed descriptions thereof, reference is made to other embodiments.

As shown in FIG. 3, the first insulating layer 510 and the light-blocking portion 810 may have a shape patterned such that the upper surface of the first electrode 210 is exposed. When the display device 10 is manufactured, as shown in FIG. 5, such a structure may be formed by sequentially forming the first insulating layer 510 and the light-blocking portion 810 and then patterning the first insulating layer 510 and the light-blocking portion 810 together in a process. However, the disclosure is not limited thereto, and the light-blocking portion 810 may be formed after the first electrode 210 is partially exposed by patterning the first insulating layer 510.

Figure 6:
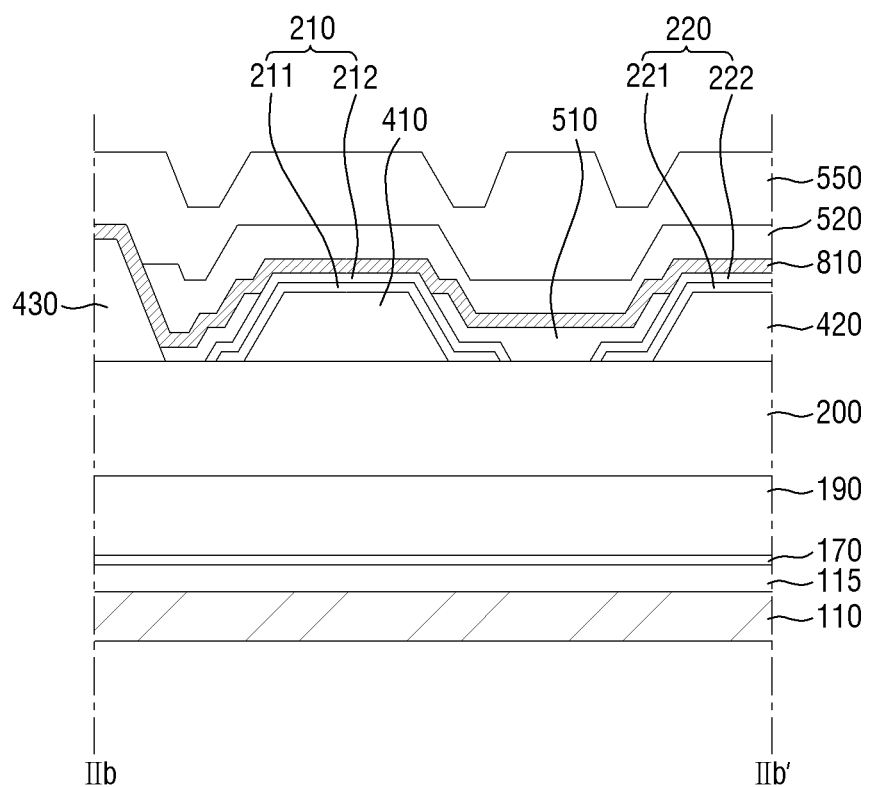
FIG. 6 is a schematic cross-sectional view illustrating a cross section of a non-emission area of a display device according to another embodiment.

FIG. 6 is a schematic cross-sectional view illustrating a cross section of a non-emission area of a display device according to an embodiment.

Referring to FIG. 6, a shape of a first insulating layer 510 may be substantially identical to that of FIG. 3 rather than that of FIG. 5. On the other hand, a light-blocking portion 810 may contact an upper surface of a first electrode 210 exposed by patterning the first insulating layer 510. As described above, such a structure may be formed by patterning the first insulating layer 510 and disposing the light-blocking portion 810 thereon. Even in the embodiment of FIG. 6, the light-blocking portion 810 may cover or overlap electrodes 210 and 220 in a non-emission area NLA so that incident light IL incident from the outside may be absorbed.

Referring again to FIG. 3, the second insulating layer 520 may be disposed on the light-emitting element 300. The second insulating layer 520 may protect and affix the light-emitting element 300. The second insulating layer 520 may be disposed to surround an outer surface of the light-emitting element 300. For example, a portion of a material of the second insulating layer 520 may be disposed between a lower surface of the light-emitting element 300 and the first insulating layer 510. The second insulating layer 520 may extend in the second direction D2 between the first electrode branch portion 210B and the second electrode branch portion 220B to have an island shape or a linear shape in a plan view.

The second insulating layer 520 may expose both side surfaces of the light-emitting element 300. Therefore, the contact electrode 260 may smoothly contact the side surfaces of both end portions of the light-emitting element 300. However, the disclosure is not limited thereto, and the second insulating layer 520 may be aligned with both ends of the light-emitting element 300.

The contact electrode 260 may be disposed on each of the electrodes 210 and 220 and the second insulating layer 520. The contact electrode 260 may include the first contact electrode 261 disposed on the first electrode 210 and the second contact electrode 262 disposed on the second electrode 220. The first contact electrode 261 and the second contact electrode 262 may be spaced apart from each other on the second insulating layer 520. Accordingly, the second insulating layer 520 may insulate the first contact electrode 261 and the second contact electrode 262 from each other.

The first contact electrode 261 may electrically contact the first electrode 210 exposed by patterning the first insulating layer 510, the first insulating layer 510, the light-emitting element 300, and the second insulating layer 520. The second contact electrode 262 may electrically contact the second electrode 220 exposed by patterning the first insulating layer 510, the first insulating layer 510, the light-emitting element 300, and the second insulating layer 520. The first contact electrode 261 and the second contact electrode 262 may electrically contact the side surfaces of both end portions of the light-emitting element 300, for example, the first conductivity-type semiconductor 310, and the second conductivity-type semiconductor 320 or the electrode layer 370, respectively. As described above, the first insulating layer 510 may be formed to have the flat upper surface so that the contact electrode 260 may smoothly contact the side surfaces of the light-emitting element 300.

The first contact electrode 261 may partially contact the light-blocking portion 810 disposed between the first electrode 210 and the third bank 430. The first contact electrode 261 may be disposed to be spaced apart from the third bank 430 and thus may partially overlap the light-blocking portion 810.

The contact electrode 260 may include a conductive material. For example, the contact electrode 260 may include ITO, IZO, ITZO, aluminum (Al), or the like. However, the disclosure is not limited thereto.

The passivation layer 550 may be formed on the second insulating layer 520 and the contact electrode 260 and may perform a function of protecting members disposed on the via layer 200 from an external environment.

Each of the first insulating layer 510, the second insulating layer 520, and the passivation layer 550 may include an inorganic insulating material or an organic insulating material. In an embodiment, the first insulating layer 510 and the passivation layer 550 may include a material such as silicon oxide ($SiO_x$), silicon nitride ($SiN_x$), silicon oxynitride ($SiO_xN_y$), aluminum oxide ($Al_2O_3$), or aluminum nitride (AlN). The second insulating layer 520 may include a photoresist or the like as an organic insulating material. However, the disclosure is not limited thereto.

Figure 7:
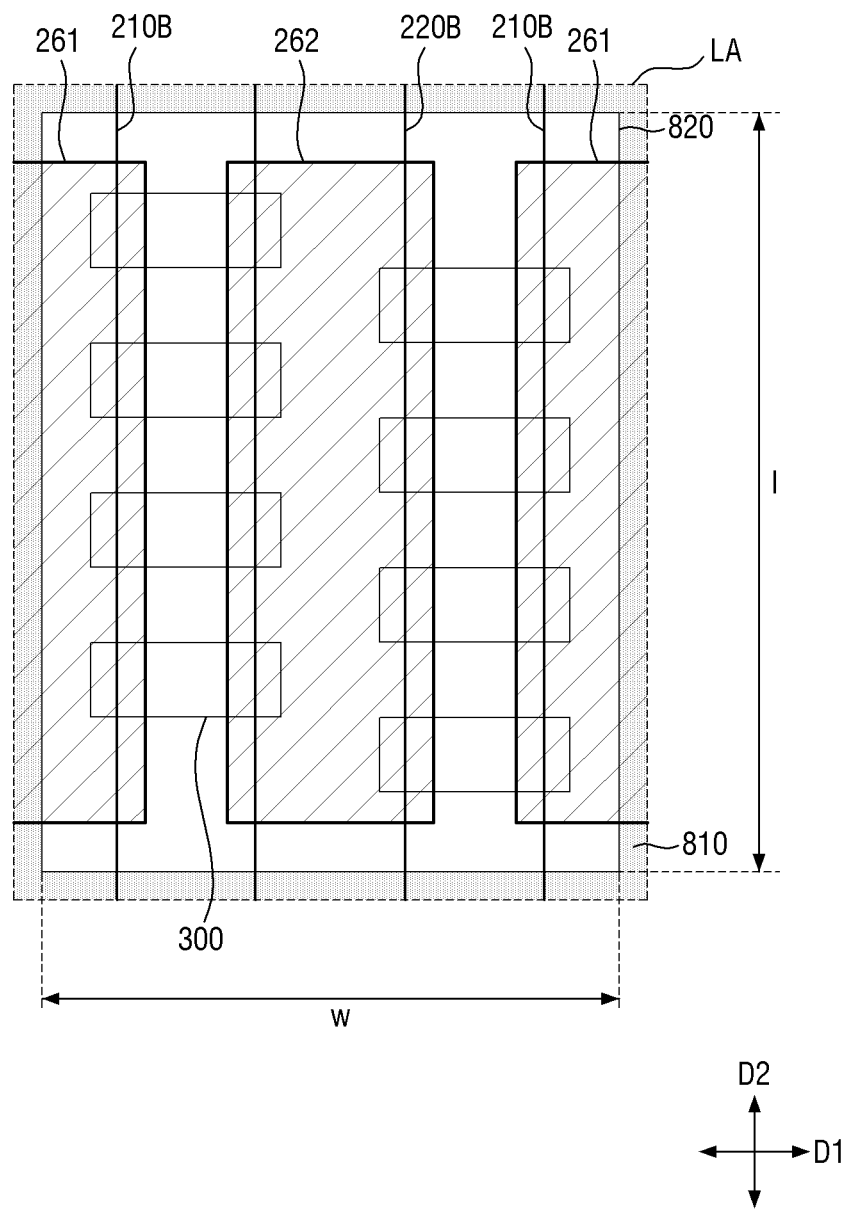
FIG. 7 is a schematic enlarged view of an emission area of FIG. 1.

FIG. 7 is a schematic enlarged view of the emission area of FIG. 1.

According to an embodiment, the light-blocking layer 800 of the display device 10 may include the opening pattern 820, and the opening pattern 820 may have an area, in which light-emitting element 300 may be disposed and which corresponds to an amount of light required for each subpixel PXn.

Referring to FIG. 7, the opening pattern 820 may have a predetermined width w in the first direction D1 and may have a length 1 extending in the second direction D2. As shown in the drawing, in the opening pattern 820 according to an embodiment, the width w, which is an interval measured in the first direction D1, may be less than the length 1, which is a distance measured in the second direction D2. However, the disclosure is not limited thereto.

As described above, the light-emitting element 300 may be disposed in an area in which the electrodes 210 and 220 overlap the opening pattern 820, and the area may be defined as the emission area LA. In the display device 10, the light-blocking portion 810 may be disposed in the non-emission area NLA excluding the emission area LA, thereby reducing reflection of external light caused in the non-emission area NLA.

The area of the emission area LA or the opening pattern 820 may vary according to an amount of light required for each subpixel PXn. For example, the area of the opening pattern 820 may be determined according to the number of the light-emitting elements 300 required to satisfy an amount of light required by a subpixel PXn.

For example, in order to satisfy the amount of light required for the subpixel PXn, in case that n light-emitting elements 300, for example, eight light-emitting elements 300 as shown in the drawing, are required, the opening pattern 820 may have an area in which the eight light-emitting elements 300 may be disposed. Here, a minimum area of the opening pattern 820 may be determined according to the array of the light-emitting elements 300 and the diameter and length of the light-emitting element 300. In case that the eight light-emitting elements 300 are disposed in a 2×4 matrix array, the width w of the opening pattern 820 may be at least twice the length of the light-emitting element 300, and the length 1 of the opening pattern 820 may be at least four times the diameter of the light-emitting element 300.

In an embodiment, in case that an amount of light required per subpixel PXn of the display device 10 is determined, the number of the light-emitting elements 300 required per subpixel PXn may be calculated by (amount of light)/(current efficiency of light-emitting element×current per subpixel). Accordingly, the minimum area of the emission area LA or opening pattern 820 may be determined from the calculated number of the light-emitting elements 300. However, the disclosure is not limited thereto, and in some embodiments, the opening pattern 820 may have a wider or narrower area.

The light-emitting element 300 may include a semiconductor crystal doped with arbitrary conductivity-type (for example, p- or n-type) impurities. The semiconductor crystal may receive an electrical signal applied from an external power source and emit light having a specific wavelength in response to the received electrical signal.

The light-emitting element 300 may be a light-emitting diode, and specifically, the light-emitting element 300 may be an inorganic light-emitting diode which has a size of a micrometer or nanometer unit and is made of an inorganic material. In case that the light-emitting element 300 is the inorganic light-emitting diode, and in case that an electric field is formed between two facing electrodes in a specific direction, the inorganic light-emitting diode may be aligned between the two electrodes in which a polarity is formed therebetween. Therefore, by forming an electric field, the light-emitting element 300 having a micro-size may be aligned on electrodes of the display device 10. The light-emitting elements 300 may receive an electrical signal from the electrodes to emit light having a specific wavelength.

Figure 8:
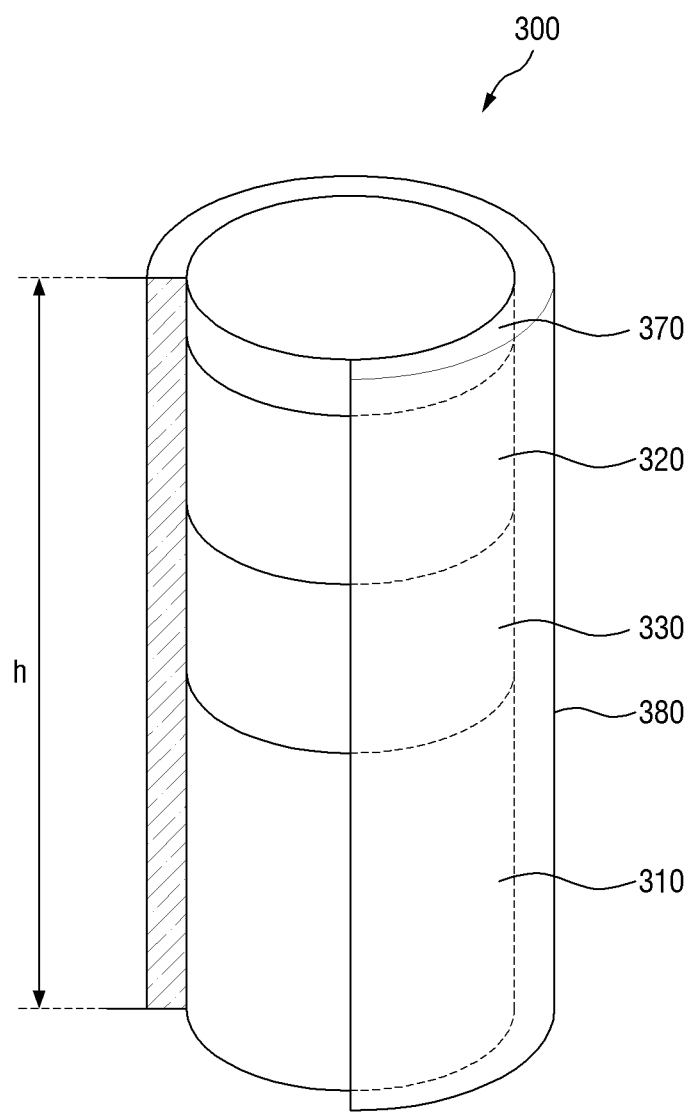
FIG. 8 is a schematic perspective view of a light-emitting element according to an embodiment.

FIG. 8 is a schematic diagram of a light-emitting element according to an embodiment.

Referring to FIG. 8, a light-emitting element 300 according to an embodiment may include conductivity-type semiconductors 310 and 320, an active layer 330, an electrode layer 370, and an insulating film 380. The conductivity-type semiconductors 310 and 320 may transmit electrical signals transmitted to the light-emitting element 300 to the active layer 330, and the active layer 330 may emit light having a specific wavelength.

Specifically, the light-emitting element 300 may include a first conductivity-type semiconductor 310, a second conductivity-type semiconductor 320, the active layer 330 disposed between the first conductivity-type semiconductor 310 and the second conductivity-type semiconductor 320, the electrode layer 370 disposed on the second conductivity-type semiconductor 320, and the insulating film 380 surrounding outer surfaces of the first and second conductivity-type semiconductors 310 and 320, the active layer 330, and the electrode layer 370. In FIG. 8, the light-emitting element 300 is illustrated as having a structure in which the first conductivity-type semiconductor 310, the active layer 330, the second conductivity-type semiconductor 320, and the electrode layer 370 are sequentially formed in a length direction thereof, but the disclosure is not limited thereto. The electrode layer 370 may be omitted, and in some embodiments, the electrode layer 370 may also be disposed on at least one of both side surfaces of the first conductivity-type semiconductor 310 and the second conductivity-type semiconductor 320. The same description may be applied to the light-emitting element 300 to be described below in case that the light-emitting element 300 further includes another structure.

The first conductivity-type semiconductor 310 may be an n-type semiconductor layer. As an example, in case that the light-emitting element 300 emits light having a blue wavelength, the first conductivity-type semiconductor 310 may be made of a semiconductor material having a formula of $In_xAl_yGa_{1-x-y}N$ ($0 \leq x \leq 1$, $0 \leq y \leq 1$, and $0 \leq x+y \leq 1$). For example, the first conductivity-type semiconductor 310 may be made of at least one selected from among InAlGaN, GaN, AlGaN, InGaN, AlN, and InN which are doped with an n-type dopant. The first conductivity-type semiconductor 310 may be doped with a first conductivity-type dopant. As an example, the first conductivity-type dopant may be silicon (Si), germanium (Ge), tin (Sn), or the like. The first conductivity-type semiconductor 310 may have a length ranging from about 1.5 µm to about 5 µm, but the disclosure is not limited thereto.

The second conductivity-type semiconductor 320 may be a p-type semiconductor layer. As an example, in case that the light-emitting element 300 emits light having a blue wavelength, the second conductivity-type semiconductor 320 may be made of a semiconductor material having a formula of $In_xAl_yGa_{1-x-y}N$ ($0 \leq x \leq 1$, $0 \leq y \leq 1$, and $0 \leq x+y \leq 1$). For example, the second conductivity-type semiconductor 320 may be made of at least one selected from among InAlGaN, GaN, AlGaN, InGaN, AlN, and InN which are doped with a p-type dopant. The second conductivity-type semiconductor 320 may be doped with a second conductivity-type dopant. As an example, the second conductivity-type dopant may be magnesium (Mg), zinc (Zn), calcium (Ca), selenium (Se), barium (Ba), or the like. The second conductivity-type semiconductor 320 may have a length ranging from about 0.08 μm to about 0.25 μm, but the disclosure is not limited thereto.

In the drawing, each of the first conductivity-type semiconductor 310 and the second conductivity-type semiconductor 320 is illustrated as including a layer, but the disclosure is not limited thereto. In some embodiments, the first conductivity-type semiconductor 310 and the second conductivity-type semiconductor 320 may include more layers according to the material of the active layer 330 to be described below.

The active layer 330 may be disposed between the first conductivity-type semiconductor 310 and the second conductivity-type semiconductor 320 and may include a material having a single or multi-quantum well structure. In case that the active layer 330 includes a material having a multi-quantum well structure, the active layer 330 may have a structure in which quantum layers and well layers are alternately stacked. The active layer 330 may emit light by coupling of electron-hole pair in response to an electrical signal applied through the first conductivity-type semiconductor 310 and the second conductivity-type semiconductor 320. As an example, in case that the active layer 330 emits light having a blue wavelength, the active layer 330 may include a material such as AlGaN or AlInGaN. In case that the active layer 330 has a multi-quantum well structure in which quantum layers and well layers are alternately stacked, the quantum layer may include a material such as AlGaN or AlInGaN, and the well layer may include a material such as GaN or AlGaN.

However, the disclosure is not limited thereto, and the active layer 330 may have a structure in which a semiconductor material having high band gap energy and a semiconductor material having low band gap energy are alternately stacked or may include other Group III to V semiconductor materials according to a wavelength of emitted light. Accordingly, light emitted by the active layer 330 is not limited to light having a blue wavelength, and in some embodiments, the active layer 330 may emit light having a red or green wavelength. The active layer 330 may have a length ranging from about 0.05 μm to about 0.25 μm, but the disclosure is not limited thereto.

Light emitted from the active layer 330 may be emitted not only to an outer surface of the light-emitting element 300 in the length direction thereof but also to both side surfaces of the light-emitting element 300. The direction of the light emitted from the active layer 330 is not limited to one direction.

The electrode layer 370 may be an ohmic contact electrode. However, the disclosure is not limited thereto, and the electrode layer 370 may be a Schottky contact electrode. The electrode layer 370 may include a conductive metal. For example, the electrode layer 370 may include at least one selected from among aluminum (Al), titanium (Ti), indium (In), gold (Au), silver (Ag), ITO, IZO, and ITZO. The electrode layer 370 may include a same material or different materials, but the disclosure is not limited thereto.

The insulating film 380 may be formed to contact and surround the outer surfaces of the first conductivity-type semiconductor 310, the second conductivity-type semiconductor 320, the active layer 330, and the electrode layer 370. The insulating film 380 may protect such members (e.g., the first conductivity-type semiconductor 310, the second conductivity-type semiconductor 320, the active layer 330, and the electrode layer 370). As an example, the insulating film 380 may surround side surfaces of the members (e.g., first conductivity-type semiconductor 310, the second conductivity-type semiconductor 320, the active layer 330, and the electrode layer 370) and may be formed to expose both end portions of the light-emitting element 300 in the length direction thereof. However, the disclosure is not limited thereto.

The insulating film 380 may include at least one selected from among materials having insulating properties, for example, silicon oxide ($SiO_x$), silicon nitride ($SiN_x$), silicon oxynitride ($SiO_xN_y$), aluminum nitride (AlN), and aluminum oxide ($Al_2O_3$). Accordingly, it is possible to prevent an electrical short circuit that may occur in case that the active layer 330 directly contacts an electrode through which an electrical signal is transmitted to the light-emitting element 300. Since the insulating film 380 protects the outer surface of the light-emitting element 300 including the active layer 330, it is possible to prevent a decrease in luminous efficiency.

In the drawing, the insulating film 380 is illustrated as being formed to extend in the length direction of the light-emitting element 300 and to cover the first conductivity-type semiconductor 310 to the electrode material layer 370, but the disclosure is not limited thereto. The insulating film 380 may cover only the first conductivity-type semiconductor 310, the active layer 330, and the second conductivity-type semiconductor 320 or may cover a portion of the outer surface of the electrode layer 370 so that the portion of the outer surface of the electrode layer 370 may be exposed.

The insulating film 380 may have a thickness ranging from about 0.5 μm to about 1.5 μm, but the disclosure is not limited thereto.

In some embodiments, an outer surface of the insulating film 380 may be surface-treated. When the display device 10 is manufactured, the light-emitting element 300 may be sprayed on electrodes dispersed in a predetermined ink and be aligned. Here, in order for the light-emitting element 300 to remain dispersed without being aggregated with other adjacent light-emitting elements 300 in the ink, the surface of the insulating film 380 may be hydrophobic- or hydrophilic-treated.

The light-emitting element 300 may have a shape extending in a direction. The light-emitting-element 300 may have a shape such as a nanorod, a nanowire, or a nanotube. In an embodiment, the light-emitting element 300 may have a cylindrical shape or a rod-like shape. However, the shape of the light-emitting element 300 is not limited thereto, and the light-emitting element 300 may have various shapes such as a regular hexahedron, a rectangular parallelepiped, and a hexagonal column.

Figure 9:
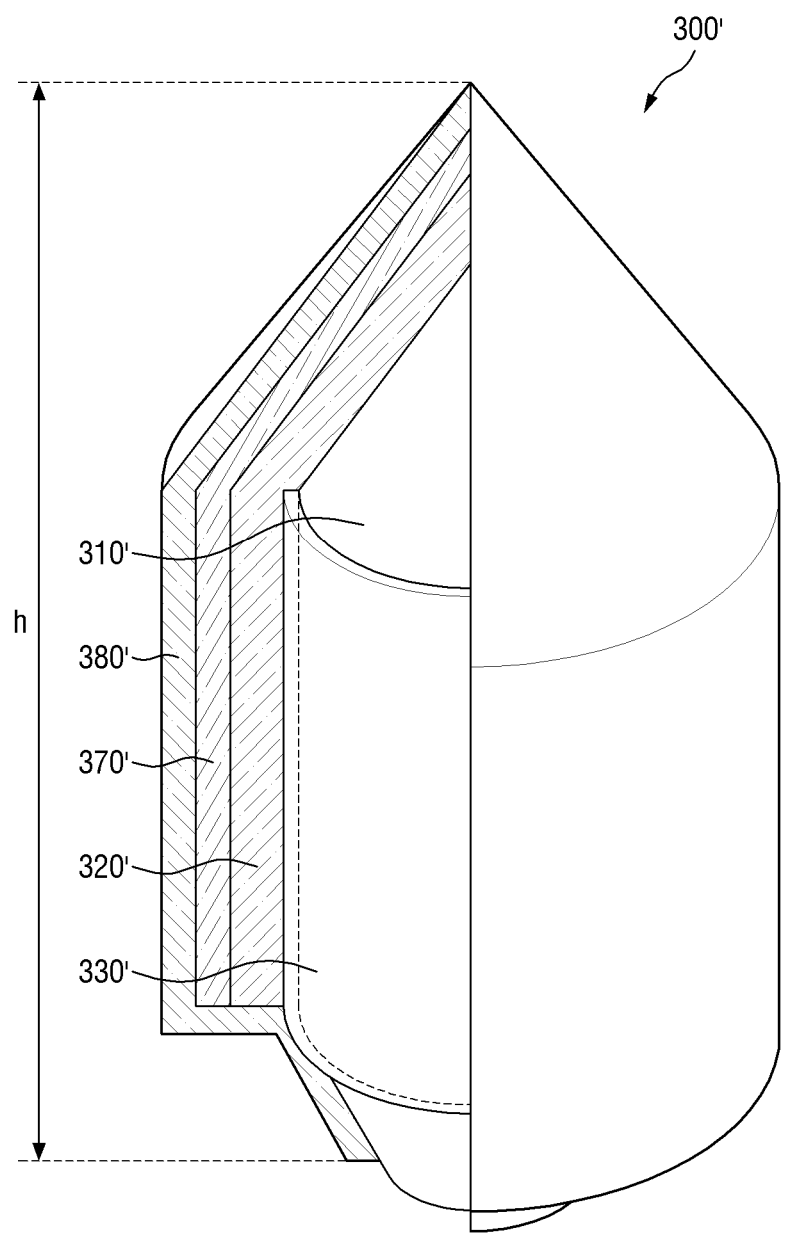
FIG. 9 is a schematic perspective view of a light-emitting element according to another embodiment.

FIG. 9 is a schematic view of a light-emitting element according to an embodiment.

Referring to FIG. 9, layers of a light-emitting element 300' may not be stacked in a direction, and each layer may be formed to surround an outer surface of another layer. The light-emitting element 300' of FIG. 9 may be the same as the light-emitting element 300 of FIG. 8 except that the shape of each layer thereof is partially different from that of the light-emitting element 300. Hereinafter, the same contents will be omitted, and differences will be described.

According to an embodiment, a first conductivity-type semiconductor 310' may extend in a direction, and both end portions thereof may be formed to be inclined toward a center thereof. The first conductivity-type semiconductor 310' of FIG. 9 may include a body portion having a rod-like shape or a cylindrical shape and upper and lower end portions having a conical shape formed on and below the body portion. The upper end portion on the body portion may have a steeper inclination than the lower end portion.

An active layer 330' may be disposed to surround an outer surface of the body portion of the first conductivity-type semiconductor 310'. The active layer 330' may have an annular shape extending in a direction. The active layer 330' may not be formed on the upper end portion and the lower end portion of the first conductivity-type semiconductor 310'. For example, the active layer 330' may contact only a side surface of the first conductivity-type semiconductor 310' parallel thereto.

The second conductivity-type semiconductor 320' may be disposed to surround an outer surface of the active layer 330' and the upper end portion of the first conductivity-type semiconductor 310'. The second conductivity-type semiconductor 320' may include a body portion with an annular shape extending in a direction and an upper end portion formed to have an inclined side surface. For example, the second conductivity-type semiconductor 320' may directly contact a side surface of the active layer 330' parallel thereto and the inclined upper end portion of the first conductivity-type semiconductor 310'. However, the second conductivity-type semiconductor 320' may not be formed on the lower end portion of the first conductivity-type semiconductor 310'.

An electrode layer 370' may be disposed to surround an outer surface of the second conductivity-type semiconductor 320'. For example, the electrode layer 370' and the second conductivity-type semiconductor 320' may have substantially the same shape. For example, the electrode layer 370' may contact the entire outer surface of the second conductivity-type semiconductor 320'.

An insulating film 380' may be disposed to surround outer surfaces of the electrode layer 370' and the first conductivity-type semiconductor 310'. The insulating film 380' may directly contact the lower end portion of the first conductivity-type semiconductor 310' and exposed lower ends of the active layer 330' and the second conductivity-type semiconductor 320' including the electrode layer 370'.

The light-emitting element 300' of FIG. 9 may be disposed such that a direction in which the first conductivity-type semiconductor 310' extends is parallel to a direction horizontal to a via layer 200 of a display device 10. For example, the light-emitting element 300' may have a structure in which the layers are stacked in a direction perpendicular to the via layer 200 in a cross-sectional view.

Figure 10:
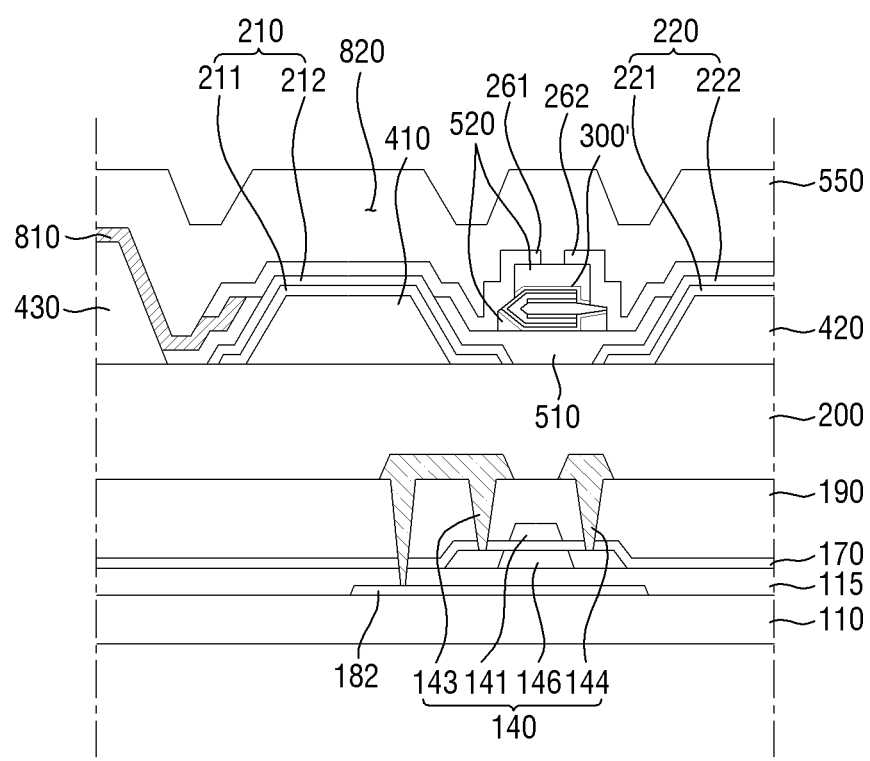
FIG. 10 is a schematic cross-sectional view illustrating a cross section of the light-emitting element disposed between electrodes according to another embodiment.

FIG. 10 is a schematic view illustrating a cross section of the light-emitting element disposed between electrodes according to an embodiment.

Referring to FIG. 10, the light-emitting element 300' of FIG. 9 may be disposed in the display device 10 according to an embodiment. The light-emitting element 300' may be disposed such that a direction in which the body portion of the first conductivity-type semiconductor 310' extends is parallel to the via layer 200. Accordingly, the light-emitting element 300' may be disposed to have a structure in which the insulating film 380', the electrode layer 370', the second conductivity-type semiconductor 320', the active layer 330', and the first conductivity-type semiconductor 310' are sequentially stacked perpendicular to the via layer 200 in a cross-sectional view. Each layer of the light-emitting element 300' may be disposed to surround the outer surface of another layer and may have a symmetrical structure with respect to a center of a cross section thereof. For example, the light-emitting element 300' may have a structure in which the active layer 330', the second conductivity-type semiconductor 320', the electrode layer 370', and the insulating film 380' may be sequentially stacked with respect to the first conductivity-type semiconductor 310'.

The insulating film 380' in areas of both end portions of the light-emitting element 300' contacting a contact electrode 260 may be partially patterned and removed. In case that a second insulating layer 520 is patterned after the light-emitting element 300' is aligned, the insulating film 380' of the light-emitting element 300' may be partially removed so that the electrode layer 370' and the first conductivity-type semiconductor 310' may be partially exposed. Such an exposed area of the light-emitting element 300' may directly contact the contact electrode 260.

The light-emitting element 300' of FIG. 9 may include the upper end portion and the lower end portion having side surfaces inclined with respect to the body portion. In the light-emitting element 300' disposed on a first insulating layer 510, a side surface of the body portion may contact the first insulating layer 510, and the inclined side surfaces of the upper and lower portions may be spaced apart from the first insulating layer 510. Referring to FIG. 10, in the display device 10 according to an embodiment, the second insulating layer 520 may be further disposed in an area between the light-emitting element 300' and the first insulating layer 510. As described above, since the second insulating layer 520 includes an organic material, when the second insulating layer 520 is formed, the second insulating layer 520 may be interposed between the light-emitting element 300' and the first insulating layer 510. Accordingly, even in case that the light-emitting element 300' has the inclined side surface, the light-emitting element 300' may be affixed onto the first insulating layer 510. However, the disclosure is not limited thereto.

A length h of the light-emitting element 300 may range from about 1 μm to about 10 μm or from about 2 μm to about 5 μm, or be about 4 μm. The light-emitting element 300 may have a diameter ranging from about 300 nm to about 700 nm, and the light-emitting elements 300 included in the display device 10 may have different diameters according to a difference in composition of the active layer 330. The light-emitting element 300 may have a diameter of about 500 nm.

Hereinafter, a method of manufacturing the display device 10 according to an embodiment will be described with reference to FIGS. 11 to 18. Hereinafter, portions of the method of manufacturing the display device 10 will be described with reference to cross-sectional views.

FIGS. 11 to 18 are schematic cross-sectional views illustrating a method of manufacturing a display device according to an embodiment. Hereinafter, a process sequence of a method of manufacturing a display device 10 will be described in detail, and the structures, materials, and functions of members formed in a manufacturing process of the display device 10 will be omitted.

Figure 11:
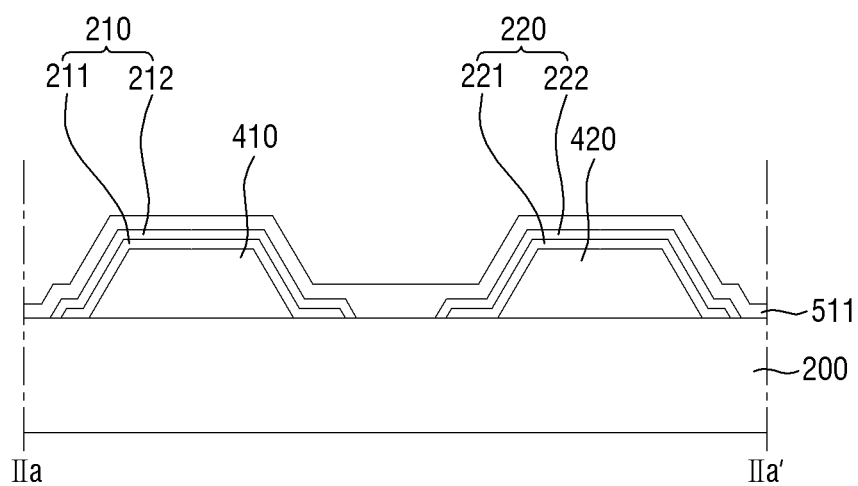
FIGS. 11 to 18 are schematic cross-sectional views illustrating a method of manufacturing a display device according to one embodiment.

Referring first to FIG. 11, a first substrate layer, which includes first and second banks 410 and 420 disposed on a via layer 200, a first electrode 210 disposed on the first bank 410, a second electrode 220 disposed on the second bank 420, and a first insulating layer 511 overlapping the first electrode 210 and the second electrode 220, is provided.

The shapes and structures of the first bank 410, the second bank 420, the first electrode 210, and the second electrode 220 may be substantially identical to those described above with reference to FIG. 3. However, unlike that shown in FIG.

3, the first insulating layer 511 may be disposed on the via layer 200 to entirely cover or overlap the via layer 200 including such members (e.g., the first and second banks 410 and 420, the first electrode 210, and the second electrode 220). The first insulating layer 511 may be patterned by an operation to be described below to form the first insulating layer 510 of FIG. 3. The first insulating layer 511 of FIG. 11 and the first insulating layer 510 of FIG. 5 may have the same shape. For example, a partial area of the first insulating layer 511 of FIG. 11 may be patterned to form the first insulating layer 510 of FIG. 3, and the remaining area thereof may not be patterned to form a shape substantially identical to the first insulating layer 510 of FIG. 5.

Although not shown in FIG. 11, a third bank 430 may be further disposed outside the first bank 410, for example, on a left side in the drawing. As described above, since banks 410, 420, and 430 may be formed at the same time in a process, the third bank 430, which is not shown in the drawing, may also be included in the first substrate layer. The third bank 430 may be formed to be higher than the first and second banks 410 and 420. According to an embodiment, an operation of forming the banks 410, 420, 430 may be performed using a slit mask, a halftone mask, or the like. However, the disclosure is not limited thereto.

Figure 12:
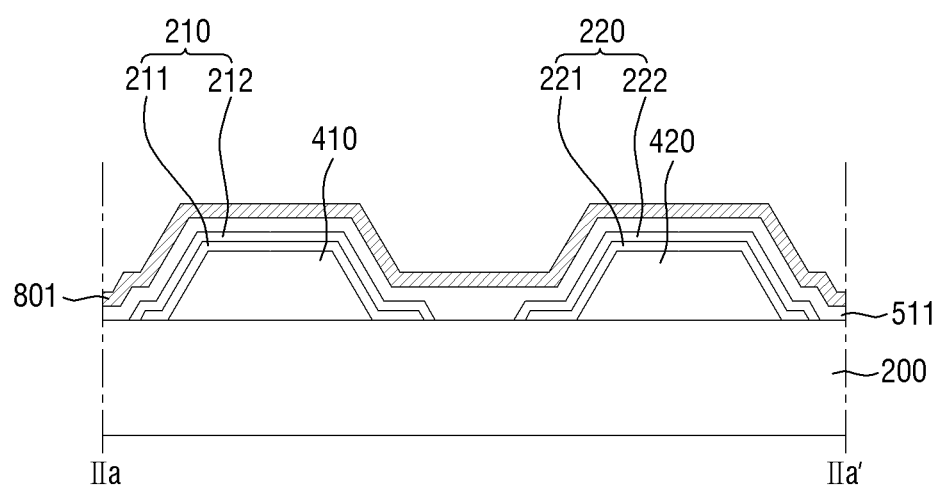

Referring to FIG. 12, a light-blocking material layer 801 may be formed on the first insulating layer 511 of the first substrate layer. The light-blocking material layer 801 may entirely cover or overlap the first insulating layer 511. For example, the light-blocking material layer 801 may overlap the first electrode 210 and the second electrode 220. The light-blocking material layer 801 may be patterned in an operation described below to form a light-blocking layer 800 including a light-blocking portion 810 and an opening pattern 820, but the disclosure is not limited thereto. The light-blocking layer 800 may be formed on the first insulating layer 511 and include the opening pattern 820.

Figure 13:
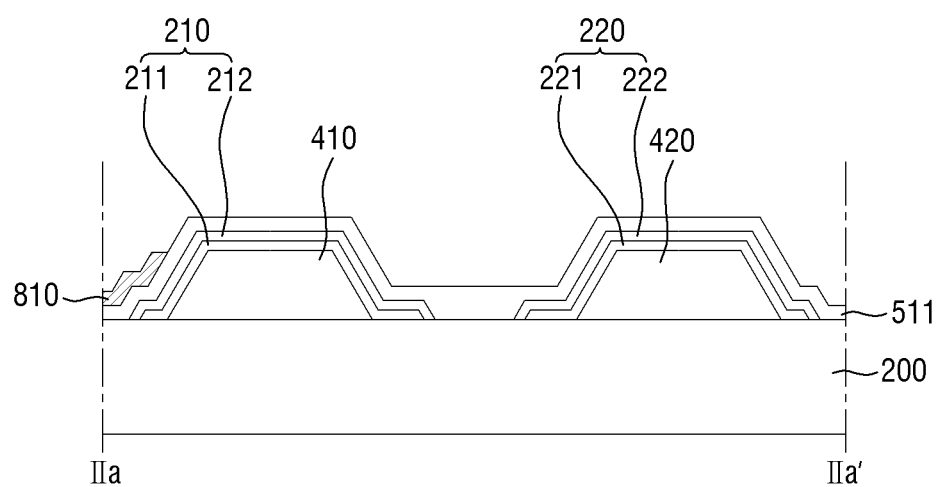

Referring to FIG. 13, at least a partial area of the light-blocking material layer 801 may be patterned to form the opening pattern 820, thereby forming the light-blocking layer 800.

The light-blocking material layer 801 may be partially patterned and removed to form the opening pattern 820, and an area thereof remaining without being patterned may form the light-blocking portion 810. For example, an area of the light-blocking material layer 801, which is patterned to form the opening pattern 820, and the light-blocking layer 800 of FIG. 3 may have a same shape, and an area of the light-blocking material layer 801, which is not patterned to form the light-blocking portion 810, and the light-blocking layer 800 of FIG. 5 may have a same shape.

Figure 14:
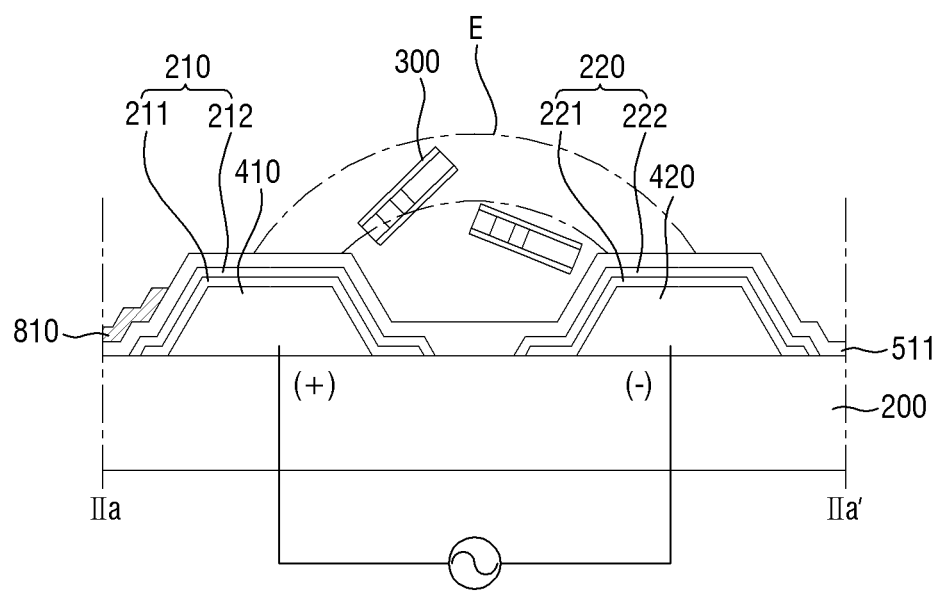
Figure 15:
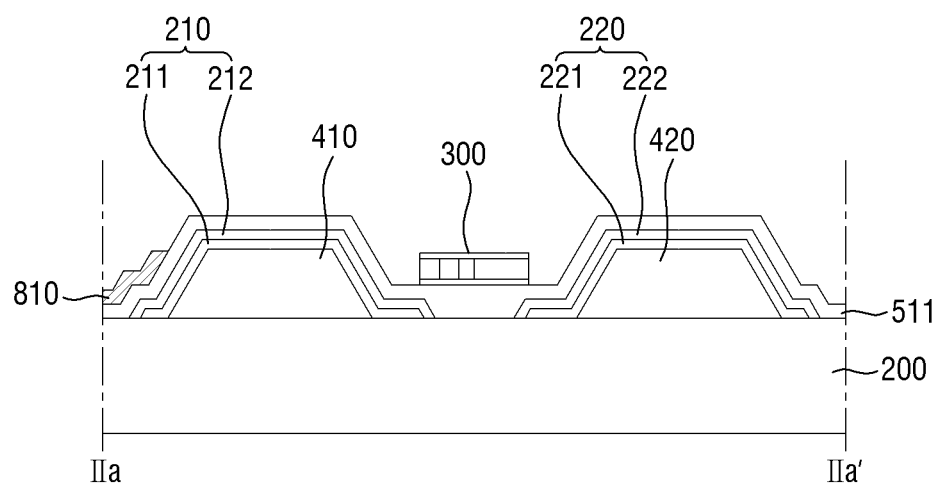

Referring to FIGS. 14 and 15, light-emitting elements 300 may be aligned in an area in which the opening pattern 820 of the light-blocking layer 800 is formed. As described above, the light-emitting elements 300 may be aligned between the first electrode 210 and the second electrode 220 which are exposed by forming the opening pattern 820.

A method of aligning the light-emitting elements 300 may be performed in such a manner that a solution including the light-emitting elements 300 is sprayed on the electrodes 210 and 220, and that alignment power is applied to each of the electrodes 210 and 220 to align the light-emitting elements 300. The alignment power may form an electric field E between the electrodes 210 and 220 to apply a dielectrophoretic force to the light-emitting elements 300. The light-emitting elements 300 may be landed between the electrodes 210 and 220 in the solution by the dielectrophoretic force.

The electric field by the alignment power may be formed only in an area in which the first electrode 210 and the second electrode 220 are exposed. For example, in an area in which the opening pattern 820 of the light-blocking layer 800 is positioned, the first electrode 210 and the second electrode 220 are exposed, and thus, the electric field may be formed in the area. However, in an area in which the light-blocking portion 810 is positioned, since the electrodes 210 and 220 are insulated from the light-blocking portion 810 by the first insulating layer 511, alignment power may not be transmitted to the area, and an electric field generated between the electrodes 210 and 220 may be blocked and may not be formed in the area. Accordingly, the light-emitting elements 300 may be selectively aligned in the area in which the opening pattern 820 is formed. However, the disclosure is not limited thereto.

Figure 16:
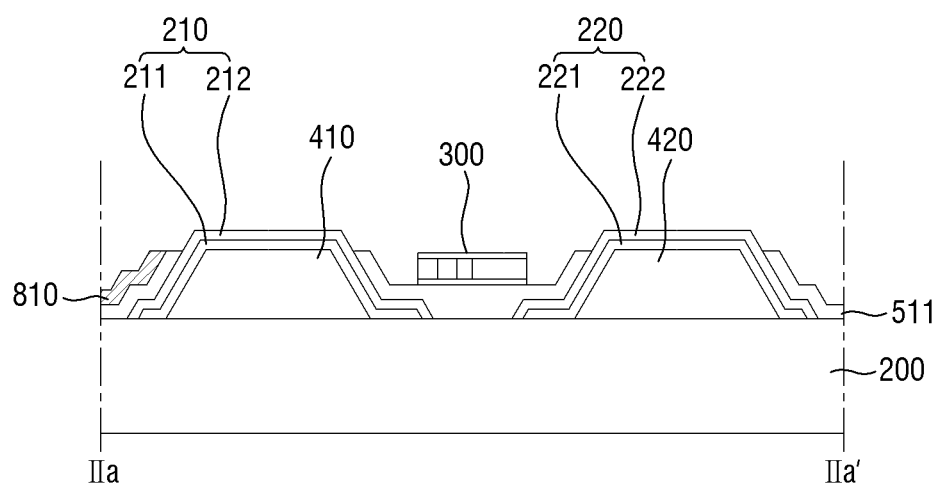

Referring to FIG. 16, at least a partial area of the first insulating layer 511 may be patterned to form a second substrate layer on which the first electrode 210 and the second electrode 220 are partially exposed.

As shown in the drawing, the first insulating layer 511 may be patterned to partially expose upper surfaces of the first electrode 210 and the second electrode 220. Accordingly, the first insulating layer 511 and the light-blocking material layer 801 may form the first insulating layer 510 and the light-blocking layer 800 of FIG. 3, respectively. Although not shown in the drawings, the first insulating layer 510 and the light-blocking layer 800 of FIG. 5 may be formed in an area of the first insulating layer 511 which is not patterned and an area of the light-blocking material layer 801 in which the light-blocking portion 810 is disposed, respectively.

In FIGS. 13 and 16, each of the first insulating layer 511 and the light-blocking material layer 801 is illustrated as being patterned, but the disclosure is not limited thereto. In some embodiments, the first insulating layer 511 and the light-blocking material layer 801 may be simultaneously patterned, or the first insulating layer 511 may be first patterned.

Figure 17:
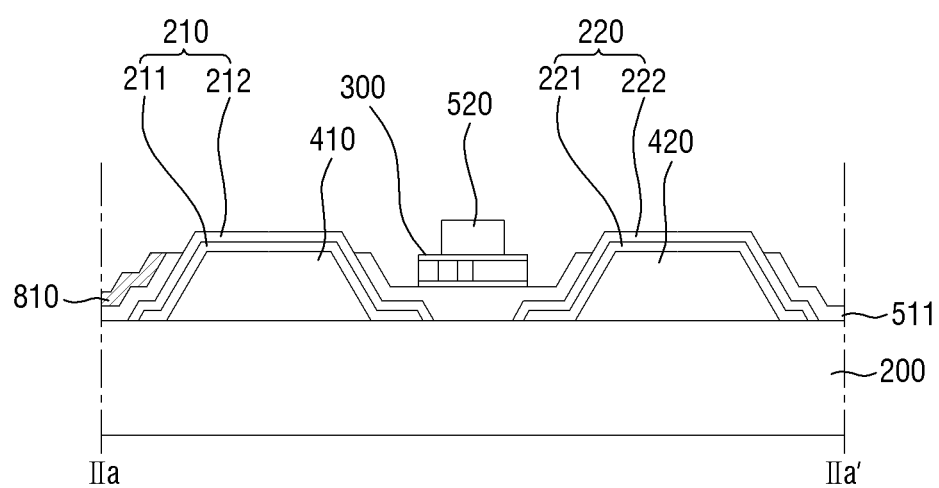
Figure 18:
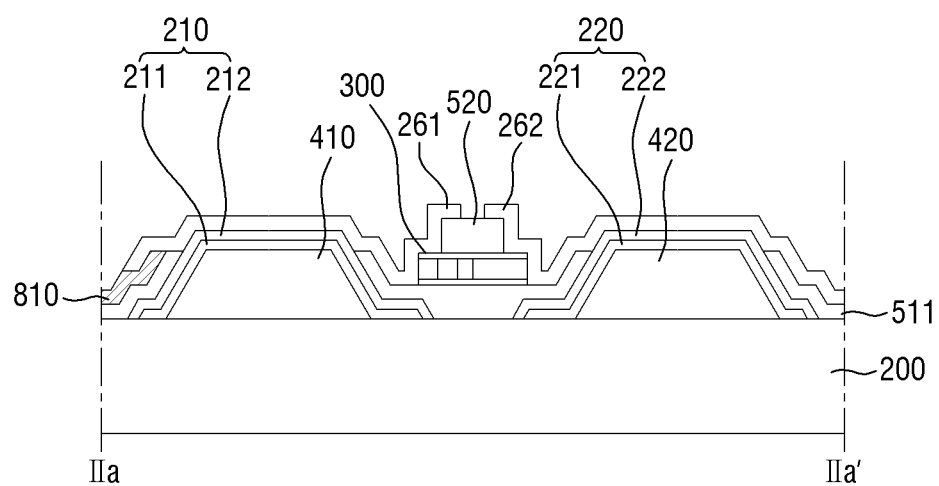

Referring to FIGS. 17 and 18, a second insulating layer 520 may be formed on the second substrate layer, and a contact electrode 260 electrically contacting the exposed first electrode 210 and second electrode 220 and the light-emitting element 300 may be formed. Descriptions of the second insulating layer 520 and the contact electrode 260 may be the same as described above. Detailed descriptions thereof will be omitted.

Although not shown in the drawings, a passivation layer 550 may be formed to cover or overlap the members disposed on the via layer 200, and the display device 10 of FIG. 3 may be manufactured. In the display device 10 manufactured by the above-described process, the light-blocking layer 800 may include the opening pattern 820 so that the light-emitting element 300 corresponding to an amount of light required for each subpixel PXn may be disposed, and at the same time, the light-blocking layer 800 may include the light-blocking portion 810 so that the reflection of external light by the display device 10 can be reduced. Accordingly, the visibility of the display device 10 can be improved.

Hereinafter, display devices 10 according to other embodiments will be described.

Figure 19:
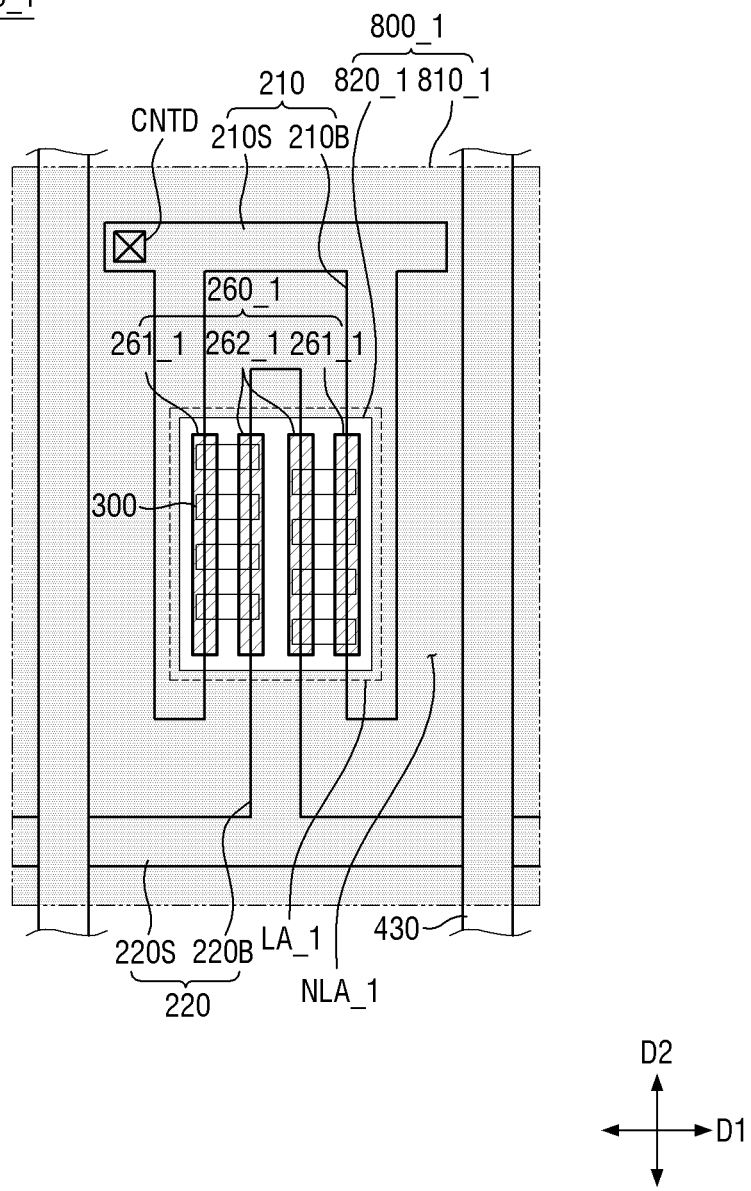
FIGS. 19 to 21 are schematic plan views of display devices according to other embodiments.
Figure 20:
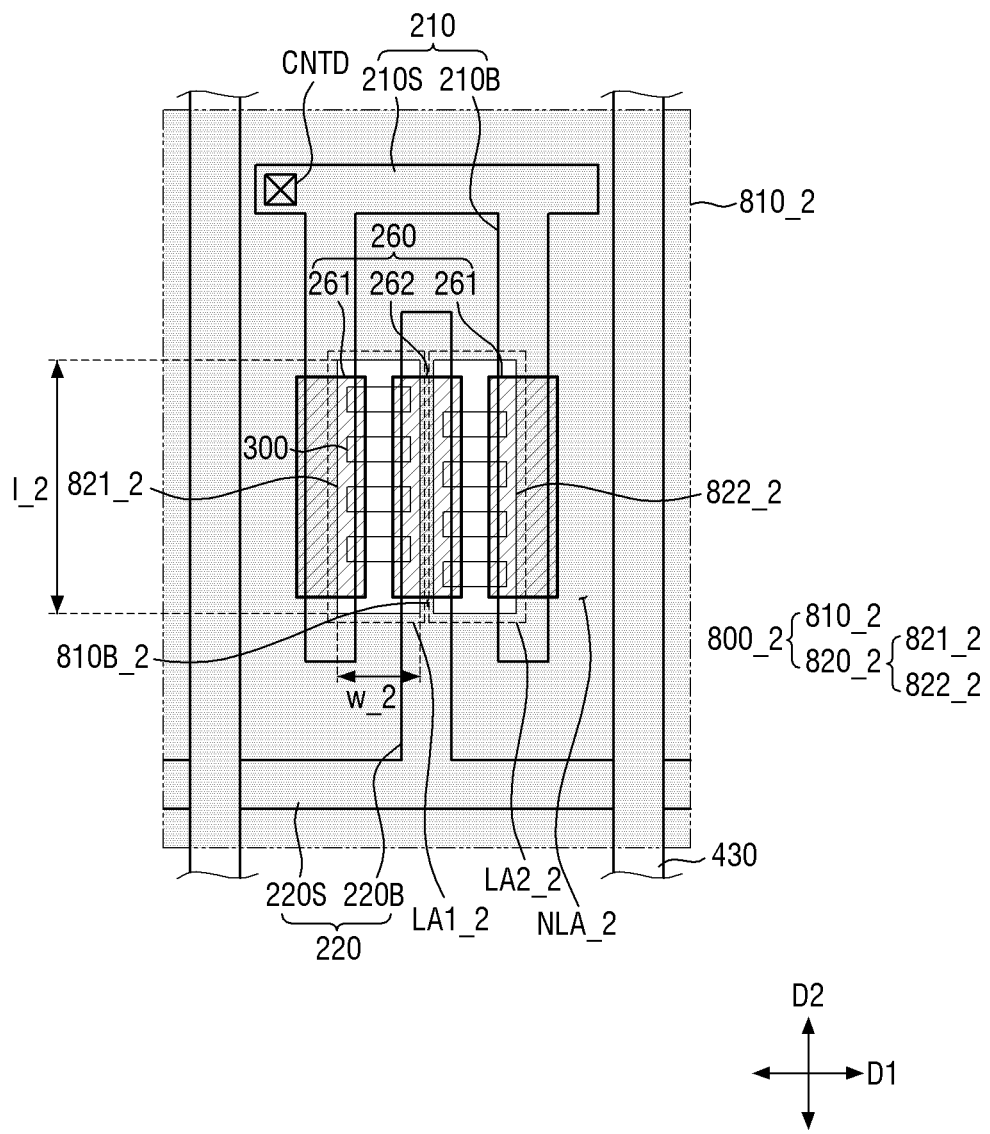
Figure 21:
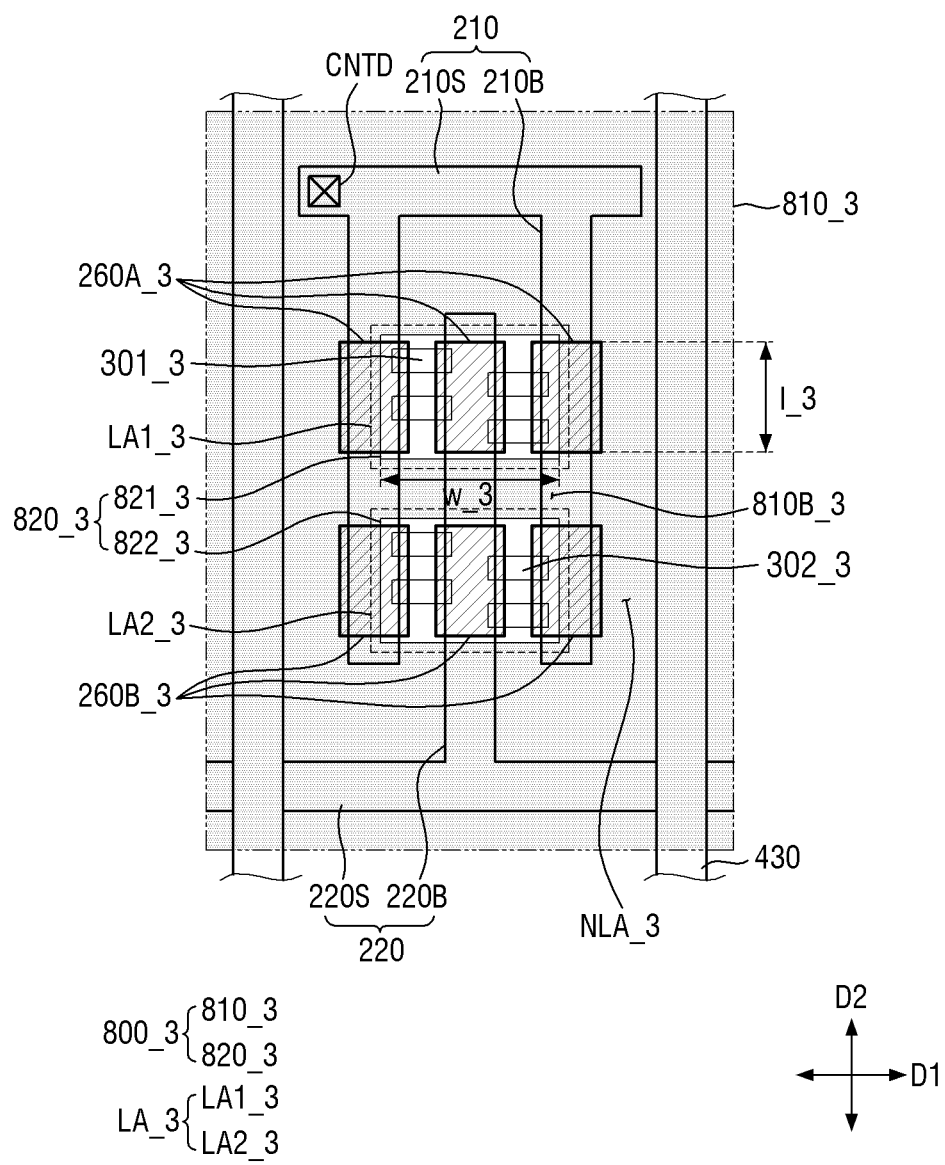

FIGS. 19 to 21 are schematic plan views of display devices according to other embodiments.

Unlike that shown in FIG. 1, FIGS. 19 to 21 illustrate only a subpixel PXn, but it is obvious that other pixels PX or subpixels PXn may have a same structure.

First, referring to FIG. 19, in a display device 10_1 according to the embodiment, contact electrodes 260_1 may be disposed only in an emission area LA_1 and may not be disposed on a light-blocking portion 810_1 of a light-blocking layer 800_1 in a non-emission area NLA_1. Unlike the display device 10 of FIG. 1, in the display device 10_1 of FIG. 19, the contact electrodes 260_1 including first and second contact electrodes 261_1 and 262_1 may have a width less than that of FIG. 1 and may extend in a second direction D2. Accordingly, the contact electrodes 260_1 may be disposed in an opening pattern 820_1 not to overlap the light-blocking portion 810_1. Other patterns spaced apart from each other may be formed on a second electrode branch portion 220B to form second contact electrodes 262_1 so as to not overlap the light-blocking portion 810_1.

The light-blocking layer 800 may include at least one opening pattern 820, and the light-blocking portion 810 may be disposed in an area thereof in which the opening pattern 820 is not formed. Referring to FIGS. 20 and 21, in display devices 10_2 and 10_3 according to the embodiments, one or more opening patterns 820 may be formed in each subpixel PXn. Accordingly, emission areas LA may be defined in each subpixel PXn.

First, in the display device 10_2 of FIG. 20, a light-blocking layer 800_2 may include an opening pattern 820_2 including a first opening pattern 821_2 and a second opening pattern 822_2 which have a predetermined width w_2 and extend in a direction, for example, a second direction D2. The first opening pattern 821_2 and the second opening pattern 822_2 may be spaced apart from each other in a first direction D1. The first and second opening patterns 821_2 and 822_2 may have a shape extending in a length direction thereof, and the width w_2 thereof may be less than a length 1_2 thereof.

Each of the first opening pattern 821_2 and the second opening pattern 822_2 may be disposed to overlap a first electrode branch portion 210B and a second electrode branch portion 220B. The first opening pattern 821_2 and the second opening pattern 822_2 may be spaced apart from each other on the second electrode branch portion 220B. Both side portions of each of the first and second opening patterns 821_2 and 822_2 may overlap the first electrode branch portion 210B and the second electrode branch portion 220B, and light-emitting elements 300 may be disposed at central portions thereof.

The light-emitting elements 300 may be aligned on the electrode branch portions 210B and 220B exposed by the first and second opening patterns 821_2 and 822_2, and a first emission area LA1_2 and a second emission area LA2_2 may be formed in such exposed areas.

A light-blocking portion 810 may be disposed in an area between the first opening pattern 821_2 and the second opening pattern 822_2. Unlike that shown in FIG. 1, in the display device 10_2 of FIG. 20, a light-blocking portion bridge 810B_2 in a non-emission area NLA_2 extending in the second direction D2 may be formed on the second electrode branch portion 220B. The light-blocking portion bridge 810B_2 may separate the first opening pattern 821_2 and the second opening pattern 822_2 from each other and may connect the light-blocking portions 810_2 positioned at an upper side and a lower side with respect to the first and second opening patterns 821_2 and 822_2.

Although not shown in the drawing, in the display device 10_2, the light-blocking portion bridge 810B_2 may be partially formed on a second electrode 220 (or the second electrode branch portion 220B) in a cross-sectional view. For example, compared to the display device 10 of FIG. 3, the light-blocking portion bridge 810B_2 extending in the second direction D2 may be formed on the second electrode branch portion 220B, and thus, the display device 10_2 of FIG. 20 may absorb a larger amount of incident light IL. The area of the first and second emission areas LA1_2 and LA2_2 of the subpixel PXn of the display device 10_2 may be less than that of the display device 10 of FIG. 1, but the number of the light-emitting elements 300 corresponding to an amount of light required for each subpixel PXn may be equal to that of the display device 10 of FIG. 1. Accordingly, the reflection of external light by the display device 10_2 can be more effectively reduced.

Referring to FIG. 21, in a display device 10_3, a light-blocking layer 800_3 may include a first opening pattern 821_3 and a second opening pattern 822_3 which extend in a first direction D1 and have a predetermined width w_3. The first opening pattern 821_3 and the second opening pattern 822_3 may be spaced apart from each other in a second direction D2. In the display device 10_3 of FIG. 20, the width w_3 of an opening pattern 820_3 may be greater than a length 1_3 thereof.

Unlike that shown in FIG. 20, in the display device 10_3 of FIG. 21, since the first and second opening patterns 821_3 and 822_3 are spaced apart from each other in the second direction D2, areas in which light-emitting elements 300 are formed may be separated on the same electrode 210 or 220, and each of first and second contact electrodes 261 and 262 may form separated patterns.

With respect to a central portion of the subpixel PXn, in a plan view, the first opening pattern 821_3 may be disposed at an upper side, and the second opening pattern 822_3 may be disposed at a lower side. Accordingly, an emission area LA_3 may be divided into a first emission area LA1_3 positioned at an upper side and a second emission area LA2_3. A non-emission area NLA_3 may be different from the non-emission area NLA_2 of FIG. 20 at least in that a light-blocking portion bridge 810B_3 of a light-blocking portion 810_3 extending in the first direction D1 may be disposed in an area between the first opening pattern 821_3 and the second opening pattern 822_3.

First light-emitting elements 301_3 and first contact electrode pattern portions 260A 3 may be disposed on the electrodes 210 and 220 exposed by the first opening pattern 821_3. Second light-emitting elements 302_3 and second contact electrode pattern portions 260B_3 may be disposed on the electrodes 210 and 220 exposed by the second opening pattern 822_3.

Unlike that shown in FIG. 20, in the display device 10_3 of FIG. 21, a contact electrode 260 extending in a direction may be separated to form patterns spaced apart from each other, and some of the light-emitting elements 300 may form a group and thus may be spaced apart from other groups. However, the number of light-emitting elements 300 corresponding to an amount of light required for each subpixel PXn may be maintained. For example, as illustrated in FIG. 21, an amount of incident light IL, which is absorbed by the light-blocking portion bridge 810B_3 disposed between the first opening pattern 821_3 and the second opening pattern 822_3, may be increased, thereby reducing the reflection of the external light and emitting an amount of emission light EL required for each subpixel PXn.

Since the display device 10_3 of FIG. 21 may be substantially identical to the display device 10_2 of FIG. 20 except for the above descriptions, repetitive descriptions thereof will be omitted.

Figure 22:
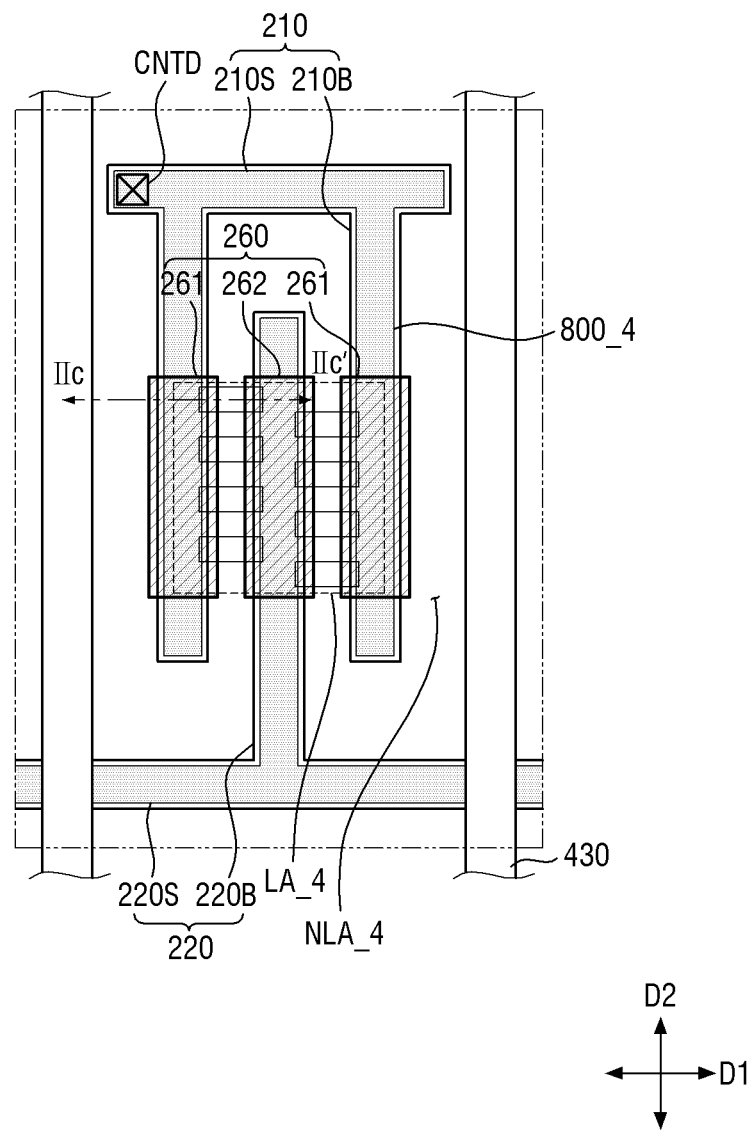
FIG. 22 is a schematic plan view of a display device according to another embodiment.
Figure 23:
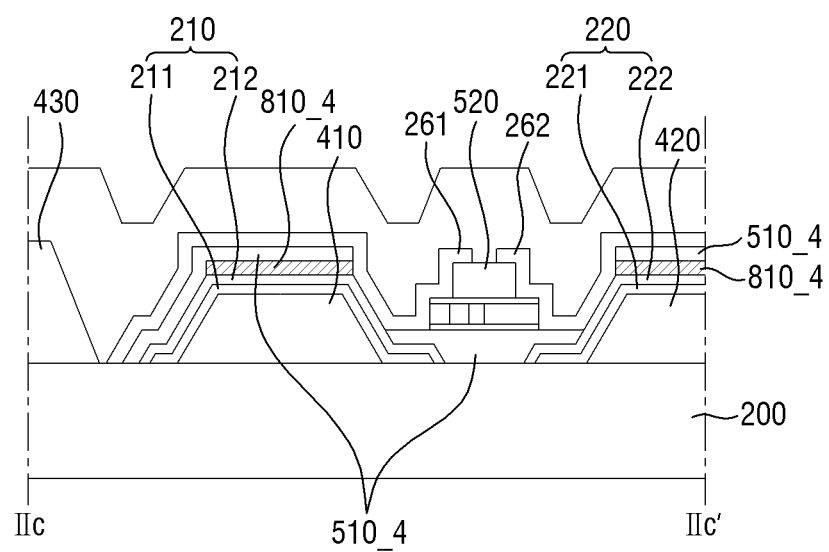
FIG. 23 is a schematic cross-sectional view taken along line IIc-IIc' of FIG. 22.

FIG. 22 is a schematic plan view of a display device according to an embodiment. FIG. 23 is a schematic cross-sectional view taken along line IIc-IIc' of FIG. 19.

As described above, in a display device 10_4 according to the embodiment, a light-blocking layer 800_4 may be disposed directly on each of electrodes 210 and 220, and the light-blocking layer 800_4 may be formed in a pattern substantially identical to that of the electrodes 210 and 220.

Referring to FIG. 22, the light-blocking layer 800_4 may be disposed to substantially cover or overlap each of the electrodes 210 and 220 and may form a pattern partially recessed inward from side portions of each of the electrodes 210 and 220. For example, a width of the light-blocking layer 800_4 in a non-emission area NLA_4 may be less than that of the electrodes 210 and 220. The light-blocking layer 800_4 of FIG. 22 may be disposed on the electrodes 210 and 220 of each subpixel PXn without being separated into a light-blocking portion 810 and an opening pattern 820. However, the light-blocking layer 800_4 may be patterned to expose partial areas of the electrodes 210 and 220, and the partial areas of the electrodes 210 and 220 not overlapping the light-blocking layer 800_4 may electrically contact a contact electrode 260 overlapping an emission area LA_4.

Referring to FIG. 23, unlike that shown in FIG. 3, the light-blocking layer 800_4 may directly contact an upper surface of each of the electrodes 210 and 220. A first insulating layer 510_4 may be disposed in an area between the first electrode 210 and the second electrode 220 and may be disposed on the light-blocking layer 800_4 including light blocking portions 810_4 and outer side surfaces of the electrodes 210 and 220. For example, compared to the display device 10 of FIG. 3, in the display device 10_4 of FIG. 23, the light-blocking layer 800_4 may be disposed between the first insulating layer 510_4 and the electrodes 210 and 220. Since the light-blocking layer 800_4 is formed to be recessed at side surfaces of the electrodes 210 and 220, the light-blocking layer 800_4 may not be disposed on inclined side surfaces of the electrodes 210 and 220 in a cross-sectional view. The contact electrode 260 may contact the inclined side surfaces of the electrodes 210 and 220.

In case that the display device 10_4 is manufactured, the shape of the light-blocking layer 800_4 may be formed by directly arranging a light-blocking material layer 801 directly on the electrodes 210 and 220 and patterning the light-blocking material layer 801 simultaneously with the electrodes 210 and 220. For example, the light-blocking layer 800_4 may be formed by forming the light-blocking material layer 801 on the electrodes 210 and 220 formed on a via layer 200 and patterning the light-blocking material layer 801 according to the shapes of the electrodes 210 and 220.

FIG. 23 illustrates the first insulating layer 510_4 as being disposed on the outer side surfaces of the electrodes 210 and 220, but the disclosure is not limited thereto. In some embodiments, the first insulating layer 510_4 may be disposed only on an upper surface of the light-blocking layer 800_4, and both inclined side surfaces of the electrodes 210 and 220 may be entirely exposed. An area in which the contact electrode 260 electrically contacts the electrodes 210 and 220 may be increased.

Accordingly, in the display device 10_4 according to the embodiment, the light-blocking layer 800_4 may cover or overlap most of the electrodes 210 and 220, and the reflection of external light by the display device 10_4 can be effectively reduced. The light-blocking layer 800_4 of the display device 10_4 may expose the electrodes 210 and 220 disposed on side surfaces of banks 410 and 420 in a cross-sectional view, and thus emission light EL emitted from a light-emitting element 300 may be reflected. In the display device 10_4 according to the embodiment, the visibility of the emission light EL can be improved.

Figure 24:
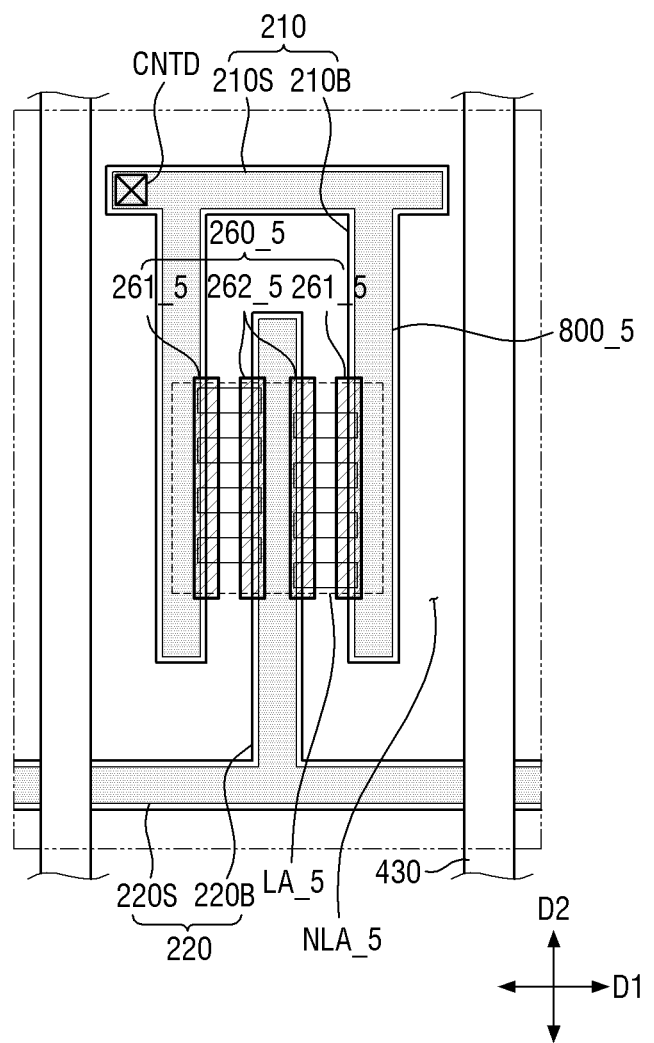
FIG. 24 is a schematic plan view of the display device of FIG. 22 according to still another embodiment.

FIG. 24 is a schematic plan view of the display device of FIG. 22 according to an embodiment.

Referring to FIG. 24, similar to the display device 10_1 of FIG. 19, in a display device 10_5 of FIG. 24, each contact electrode 260_5 including a first contact electrode 261_5 and a second contact electrode 262_5 may have a relatively narrow width and extend in a second direction D2. Other descriptions with regard to other elements including a light-blocking layer 800_5, emission area LA_5, and non-emission area NLA_5 may be substantially identical to those described above and thus will be omitted.

The display device 10 described with reference to the above drawings may have a structure in which the light-blocking layer 800 is disposed between the electrodes 210 and 220 or the first insulating layer 510, and the passivation layer 550. In case that the display device 10 is manufactured, the structure may be formed by performing a process of forming the light-blocking layer 800 before aligning the light-emitting elements 300 and aligning the light-emitting elements 300 according to the opening pattern 820.

However, the position at which the light-blocking layer 800 is disposed is not limited thereto, and in some embodiments, the light-blocking layer 800 may be formed after the light-emitting elements 300 are aligned. Accordingly, the light-blocking layers 800 according to other embodiments may be disposed on the passivation layer 550. Hereinafter, other embodiments of the display device 10 in which the light-blocking layer 800 is disposed on the passivation layer 550 will be described.

Figure 25:
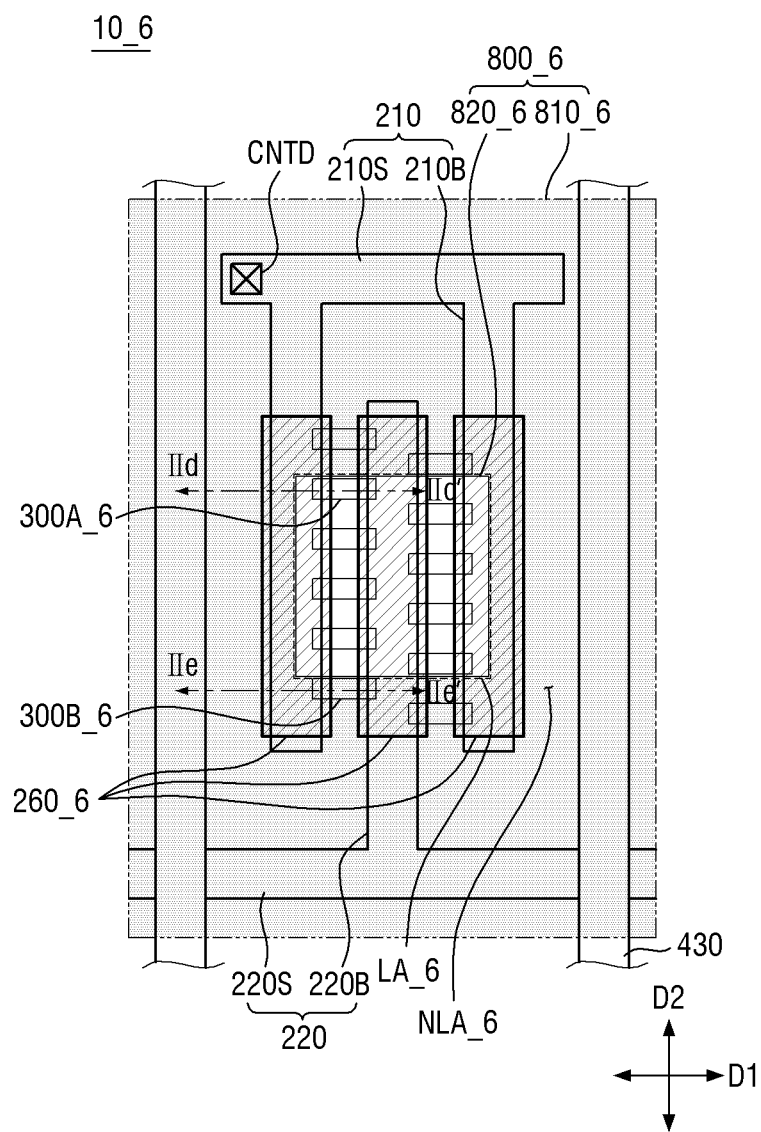
FIG. 25 is a schematic plan view of a display device according to yet another embodiment.
Figure 26:
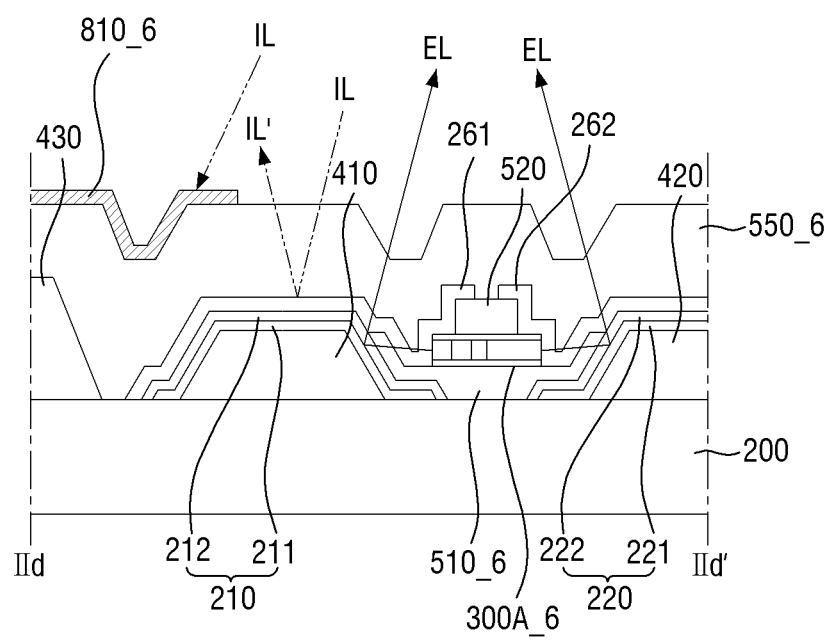
FIG. 26 is a schematic cross-sectional view taken along line IId-IId' of FIG. 25.
Figure 27:
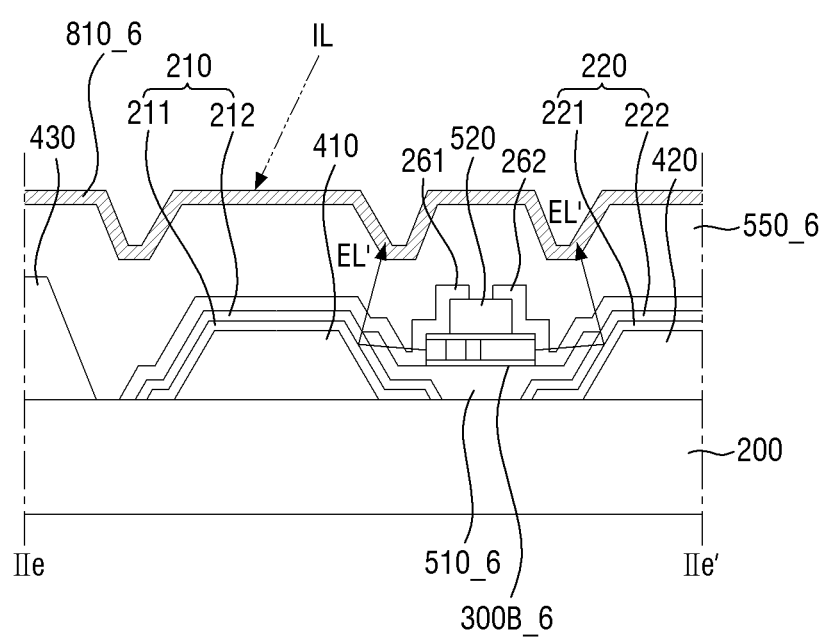
FIG. 27 is a schematic cross-sectional view taken along line IIe-IIe' of FIG. 25.

FIG. 25 is a schematic plan view of a display device according to an embodiment. FIG. 26 is a schematic cross-sectional view taken along line IId-IId' of FIG. 25, and FIG. 27 is a schematic cross-sectional view taken along line IIe-IIe' of FIG. 25. FIG. 26 is a schematic cross-sectional view including an emission area LA_6 in which an opening pattern 820_6 of a light-blocking layer 800_6 is disposed, and FIG. 27 is a schematic cross-sectional view of a non-emission area NLA_6 in which a light-blocking portion 810_6 is positioned.

A display device 10_6 of FIGS. 25 to 27 may be substantially the same as the display device 10 of FIGS. 1, 3, and 5 except that a light-blocking layer 800 is disposed on a passivation layer 550. Hereinafter, differences will be described in detail.

Referring to FIG. 25, the display device 10_6 according to the embodiment may include the light-blocking layer 800_6 including the light-blocking portion 810_6 which covers each subpixel PXn and the opening pattern 820_6 which exposes a portion of an area in which light-emitting elements 300 are disposed. Unlike that shown in FIG. 1, in the display device 10_6 of FIG. 25, the light-emitting element 300 may also be disposed in an area overlapping the light-blocking portion 810_6. For example, the light-emitting element 300 may also be disposed in a non-emission area NLA_6 of the subpixel PXn.

A contact electrode 260_6 including first and second contact electrodes 261_6 and 262_6 may also overlap the light-blocking portion 810_6 other than the opening pattern 820_6. The contact electrode 260_6 may be disposed below the light-blocking portion 810_6. For example, unlike that shown in FIG. 1, the contact electrode 260_6 may not directly contact the light-blocking portion 810_6 and may overlap the light-blocking portion 810_6 with a passivation layer 550_6 interposed therebetween.

Referring to FIGS. 26 and 27, the light-blocking portion 810_6 of the light-blocking layer 800_6 may be disposed on the passivation layer 550_6, and the opening pattern 820_6 may be formed in an area in which the light-blocking portion 810_6 is not disposed. As shown in a cross section of the display device 10_6, a first insulating layer 510_6 and the contact electrode 260_6 may not directly contact the light-blocking portion 810_6 and may be disposed to overlap the light-blocking portion 810_6.

The light-emitting elements 300 may include a first light-emitting element 300A_6 disposed in an area overlapping the opening pattern 820_6 and a second light-emitting element 300B_6 disposed in an area overlapping the light-blocking portion 810_6. Unlike that shown in FIG. 1, in the display device 10_6 of FIG. 25, the light-emitting element 300 may also be disposed in the area overlapping the opening pattern 820_6, for example, in the non-emission area NLA_6 other than the emission area LA_6.

As shown in the drawing, a portion of external incident light IL may be absorbed by the light-blocking portion 810_6, and emission light EL emitted from the light-emitting element 300 may be emitted through the opening pattern 820_6 of FIG. 25. As described above, in case that the number of the first light-emitting elements 300A_6 disposed in the opening pattern 820_6 satisfies the number of the light-emitting elements 300 corresponding to an amount of light required for each subpixel PXn, the light-blocking portion 810_6 may be disposed in an area in which the second light-emitting element 300B_6 is disposed, thereby reducing the reflection of external light. Emission light EL' emitted from the second light-emitting element 300B_6 is incident on and absorbed by the light-blocking portion 810_6. However, since an amount of light emitted from the first light-emitting element 300A_6 satisfies an amount of light required for each subpixel PXn, it is possible to reduce the reflection of external light by the light-blocking portion 810_6 in the non-emission area NLA_6.

According to an embodiment, the emission light EL' emitted from the second light-emitting element 300B_6 may be reflected below the light-blocking portion 810_6 and emitted through the opening pattern 820_6.

Figure 28:
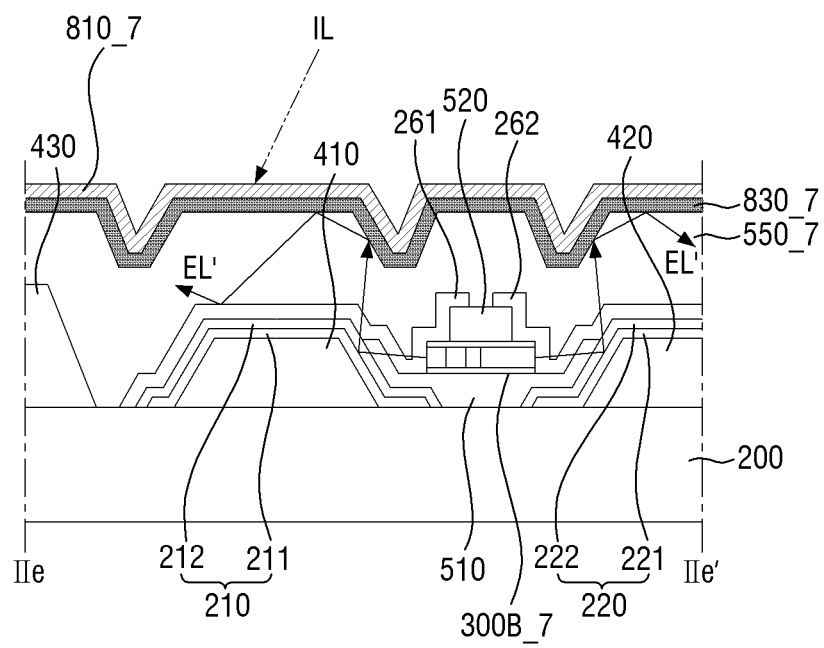
FIGS. 28 and 29 are schematic cross-sectional views illustrating cross sections of a display device according to yet another embodiment.
Figure 29:
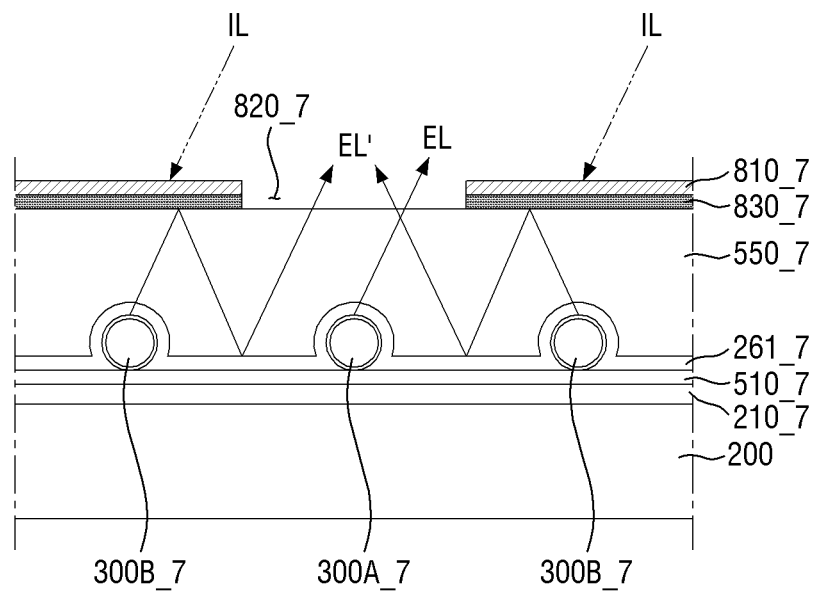

FIGS. 28 and 29 are schematic views illustrating cross sections of a display device according to an embodiment. FIG. 28 is a schematic cross-sectional view including a non-emission area in which a light-blocking portion 810_7 of a display device 10_7 is disposed, and FIG. 29 is a schematic cross-sectional view including an emission area and the non-emission area.

A light-blocking layer 800_7 of the display device 10_7 according to the embodiment may further include a reflective portion 830_7 disposed below the light-blocking portion 810_7 to reflect incident light.

Referring to FIG. 28, the display device 10_7 according to the embodiment may include the reflective portion 830_7 disposed in at least a partial area on a passivation layer 550_7 and the light-blocking portion 810_7 disposed on the reflective portion 830_7. The reflective portion 830_7 and the light-blocking portion 810_7 may be formed in substantially the same pattern, and the light-blocking portion 810_7 may be disposed in an area other than the emission area in which an opening pattern 820_7 of each subpixel PXn is formed.

As described above, in case that the light-blocking layer 800_7 is disposed on the passivation layer 550_7, a light-emitting element 300 may be disposed in each of the emission area and the non-emission area. Emission light EL emitted from a first light-emitting element 300A_7 disposed in the emission area may be emitted through the opening pattern 820_7 of the light-blocking layer 800_7.

On the other hand, emission light EL' emitted from a second light-emitting element 300B_7 disposed in the non-emission area may be absorbed by the light-blocking portion 810_7 of the light-blocking layer 800_7. The light-blocking layer 800_7 of the display device 10_7 according to the embodiment may include the reflective portion 830_7 which is disposed below the light-blocking portion 810_7 and includes a material having high reflectance. The reflective portion 830_7 may emit the emission light EL' of the second light-emitting element 300B_7 disposed in the non-emission area.

As shown in FIG. 28, the emission light EL' emitted from the second light-emitting element 300B_7 disposed in the non-emission area may be incident on the reflective portion 830_7 disposed on the passivation layer 550_7. The reflective portion 830_7 may include a material having high reflectance so that the emission light EL' may be reflected into the passivation layer 550_7 (see EL' of FIG. 28). The emission light EL', which is emitted from the second light-emitting element 300B_7 and reflected by the reflective portion 830_7, may move into the passivation layer 550_7. A contact electrode 260, a second insulating layer 520, a first insulating layer 510, and the like may be disposed below the passivation layer 550_7 and may include a material having a refractive index different from that of the passivation layer 550_7. The reflected emission light EL' incident on an interface between the passivation layer 550_7 and such members (e.g., the contact electrode 260, the second insulating layer 520, the first insulating layer 510, or the like) may be reflected again and may be incident on the reflective portion 830_7. According to an embodiment, the passivation layer 550_7 may provide a path through which the emission light EL' emitted from the second light-emitting element 300B_7 moves.

According to an embodiment, the emission light EL' reflected by the reflective portion 830_7 may be emitted by traveling to an area in which the opening pattern 820_7 is formed.

Referring to FIG. 29, the emission light EL' (see EL' of FIG. 27) emitted from the second light-emitting element 300B_7 in the non-emission area may be reflected by the reflective portion 830_7 and the interface between the passivation layer 550_7 and other members and may travel to the opening pattern 820_7 of the emission area through the passivation layer 550_7. The emission light EL emitted from the first light-emitting element 300A_7 disposed in the emission area may be emitted through the opening pattern 820_7 of the emission area.

For example, the display device 10_7 according to the embodiment may include the light-blocking portion 810_7 to reduce the reflection of external light. The display device 10_7 may include the reflective portion 830_7 between the light-blocking portion 810_7 and the passivation layer 550_7 to emit the emission light EL' emitted from the non-emission area through the emission area. Accordingly, the display device 10_7 can increase an amount of light of the subpixel PXn and can effectively reduce the reflection of external light. A first contact electrode 261_7 may overlap first and second light-emitting elements 300A_7 and 300B_7 disposed on a first insulating layer 510_7. The first insulating layer 510_7 may be disposed on a first electrode 210_7.

Figure 30:
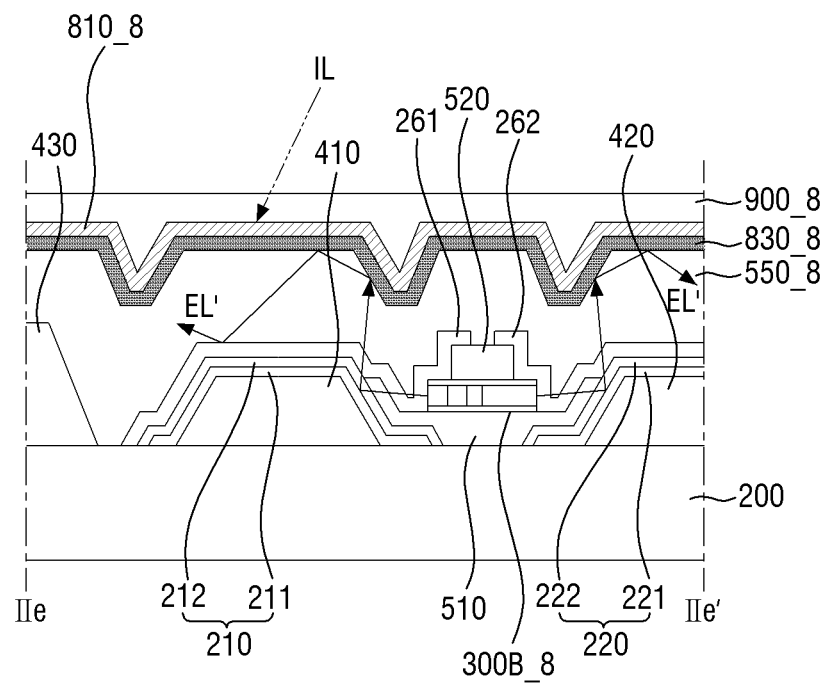
FIG. 30 is a schematic cross-sectional view of a display device according to yet another embodiment.

FIG. 30 is a schematic cross-sectional view of a display device according to an embodiment.

Referring to FIG. 30, in case that a light-blocking layer 800_8 is disposed on a passivation layer 550_8, a display device 10_8 may further include an encapsulation layer 900_8 disposed on the light-blocking layer 800_8 to protect the light-blocking layer 800_8. In order to prevent the permeation of external impurities or moisture, the encapsulation layer 900_8 may be disposed on the light-blocking layer 800_8 to seal the light-blocking layer 800_8. A light-emitting element 300B_8 may be substantially identical or similar to the second light-emitting element 300B_7 of FIG. 29.

The encapsulation layer 900_8 according to the embodiment may include a transparent material and may be entirely disposed on the light-blocking layer 800_8 regardless of an opening pattern 820. For example, the encapsulation layer 900_8 may be disposed to cover or overlap a light-blocking portion 810_8, a passivation layer 550_8 exposed by the opening pattern 820, and a reflective portion 830_8. However, the disclosure is not limited thereto, and the encapsulation layer 900_8 may be disposed only on the light-blocking portion 810_8 of the light-blocking layer 800_8.

In the drawing, the encapsulation layer 900_8 is illustrated as being formed as a layer, but the disclosure is not limited thereto. The encapsulation layer 900_8 may have a structure in which one or more layers are stacked. As an example, the encapsulation layer 900_8 may have a structure in which a first inorganic encapsulation film, an organic encapsulation film, and a second inorganic encapsulation film are sequentially stacked.

The inorganic encapsulation film of the encapsulation layer 900_8 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like. The organic encapsulation film of the encapsulation layer 900_8 may be made of at least one selected from among an acrylic-based resin, a methacrylic-based resin, polyisoprene, a vinyl-based resin, an epoxy-based resin, a urethane-based resin, a cellulose-based resin, or a perylene-based resin. However, the disclosure is not limited thereto.

The display device 10 according to an embodiment may further include a color conversion part 700 disposed on the passivation layer 550. The color conversion part 700 may include a color conversion layer 750 which converts a center wavelength of emission light EL that is emitted from a light-emitting element 300 and is incident thereon. In case that the display device 10 includes the color conversion part 700, the light-blocking layer 800 may be disposed on the color conversion part 700.

Figure 31:
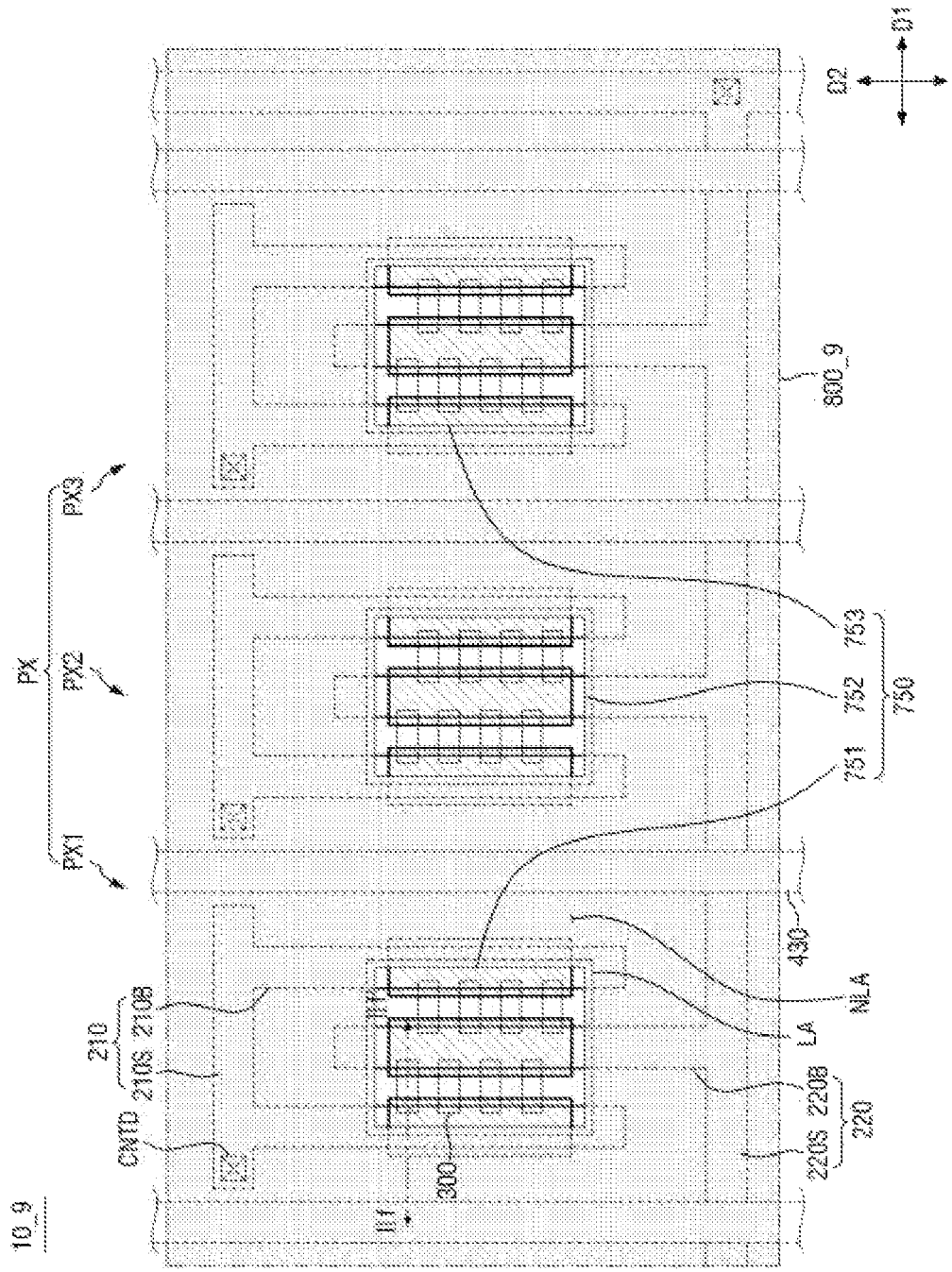
FIG. 31 is a schematic plan view of a display device according to yet another embodiment.
Figure 32:
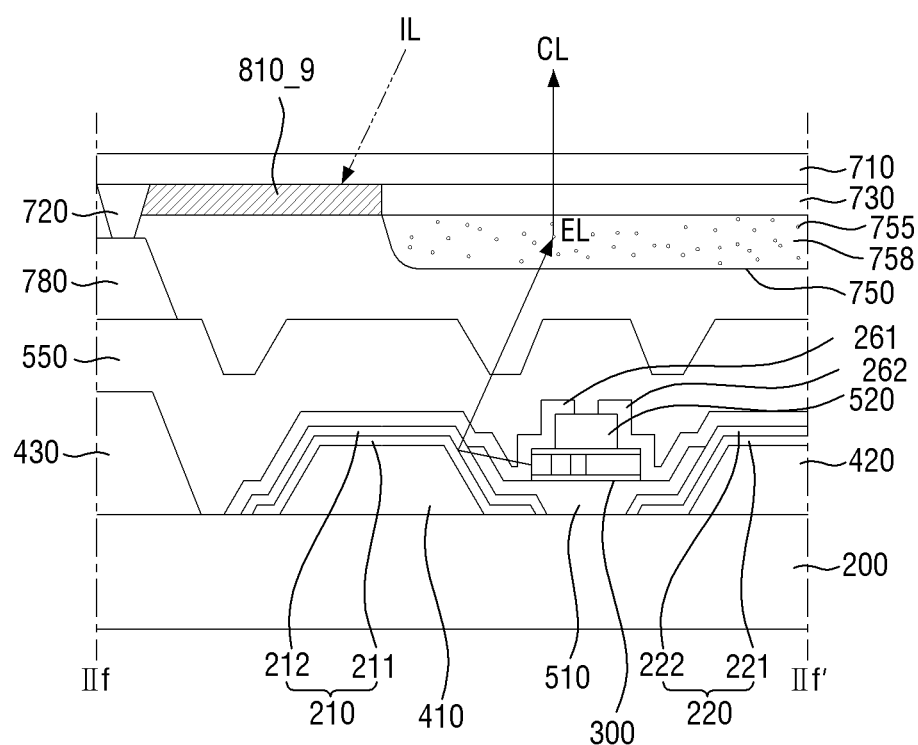
FIG. 32 is a schematic cross-sectional view taken along line IIf-IIf' of FIG. 31.

FIG. 31 is a schematic plan view of a display device according to an embodiment. FIG. 32 is a schematic cross-sectional view taken along line of FIG. 31.

Referring to FIGS. 31 and 32, a color conversion part 700 may include a base substrate 710, a light-blocking member 720, a color filter 730, a color conversion layer 750, and a step compensation structure 780. However, the disclosure is not limited thereto, and a schematic structure of the color conversion part 700 will be described below.

The base substrate 710 may be made of a material having a light-transmitting property. As an example, the base substrate 710 may be a glass substrate or a transparent plastic substrate.

The light-blocking member 720 may be disposed on the base substrate 710. Similar to the light-blocking layer 800, the light-blocking member 720 may absorb or block incident light. In FIG. 32, the light-blocking member 720 is illustrated as being disposed only at a side, but the disclosure is not limited thereto. The light-blocking member 720 may be disposed along a boundary of each pixel PX or subpixel PXn. In an embodiment, the light-blocking member 720 may form a grid pattern.

The color filter 730 may be disposed between the light-blocking members 720 on the base substrate 710. The color filter 730 may selectively transmit light with a specific color and may absorb light with other colors to block the light from traveling. For example, in case that emission light EL emitted from a light-emitting element 300 has a first color and the color filter 730 transmits light with the first color and absorbs light with other colors or blocks the transmission of the light, the light with the first color of the light-emitting element 300 may be emitted from the color conversion part 700. In contrast, in case that the color filter 730 absorbs the light with the first color or blocks the transmission of the light, the light with the first color may not be emitted from the color conversion part 700. Although not shown in the drawing, color filters 730 may be disposed in each pixel PX or subpixel PXn of a display device 10_9. The color filters 730 may transmit light beams with different colors so that the display device 10_9 may display colors.

The color conversion layer 750 may be disposed on the color filter 730. The color conversion layer 750 may include color conversion particles 755 which convert a wavelength of incident light and a base resin 758 in which the color conversion particles 755 are dispersed.

In case that light EL having a center wavelength as a first wavelength is incident on the color conversion particles 755, the color conversion particles 755 may convert the light EL into light CL with a second wavelength different from the first wavelength to emit the light CL. For example, in case that the light with the first color is incident on the color conversion particles 755, the color conversion particles 755 may emit light with a second color different from the first color.

For example, the color conversion particles 755 may be quantum dots, quantum rods, or phosphor substances. The quantum dots may be particulate matter that emits light with a specific wavelength in case that electrons transition from a conduction band to a valence band. However, the disclosure is not limited thereto.

The base resin 758 may include a material having high light transmittance and excellent or desired dispersion characteristics for the color conversion particles 755. As an example, the base resin 758 may include an organic material such as an epoxy-based resin, an acrylic-based resin, a cardo-based resin, or an imide-based resin.

As shown in FIG. 31, the color conversion part 700 of the display device 10_9 may include a first color conversion layer 750a, a second color conversion layer 750b, and a third color conversion layer 750c for each pixel PX or subpixel PXn, each overlapping an emission layer LA_9 or not overlapping a non-emission layer NLA_9. The first to third color conversion layers 750a, 750b, and 750c may convert incident light with a first color into light with different colors. For example, the first color conversion layer 750a may scatter the light with the first color to emit the light with the first color, the second color conversion layer 750b may absorb the light with the first color to emit light with a second color, and the third color conversion layer 750c may absorb the light with the first color to emit light with a third color. However, the disclosure is not limited thereto.

The step compensation structure 780 may be disposed on the light-blocking member 720. The step compensation structure 780 may be disposed between the light-blocking member 720 and a third bank 430 to perform a function of supporting the color conversion part 700. In case that a stepped portion is formed on a passivation layer 550, the step compensation structure 780 may compensate for the stepped portion formed on an upper surface of the passivation layer 550.

FIGS. 31 and 32 illustrate only the schematic structure of the color conversion part 700. However, the structure of the display device 10_9 is not limited thereto, and more members may be provided.

In the display device 10_9 according to the embodiment, a light-blocking layer 800_9 may be disposed in the color conversion part 700. The light-blocking layer 800_9 may be disposed between the light-blocking member 720 and the color filter 730 of the color conversion part 700. The light-blocking layer 800_9 may absorb incident light IL incident on the base substrate 710. The emission light EL emitted from the light-emitting element 300 may be incident on the color conversion layer 750 and may be emitted as the emission light CL having a different center wavelength.

As described above, the light-blocking layer 800_9 may include a light-blocking portion 810_9 which absorbs the incident light IL incident thereon and an opening pattern 820 in which the light-blocking portion 810_9 is not disposed. The light-blocking layer 800_9 disposed in the color conversion part 700 may include the light-blocking portion 810_9 disposed between the light-blocking member 720 and the color filter 730, and it may be understood that the color filter 730, the color conversion layer 750, and the opening pattern 820 are disposed in substantially the same area.

Figure 33:
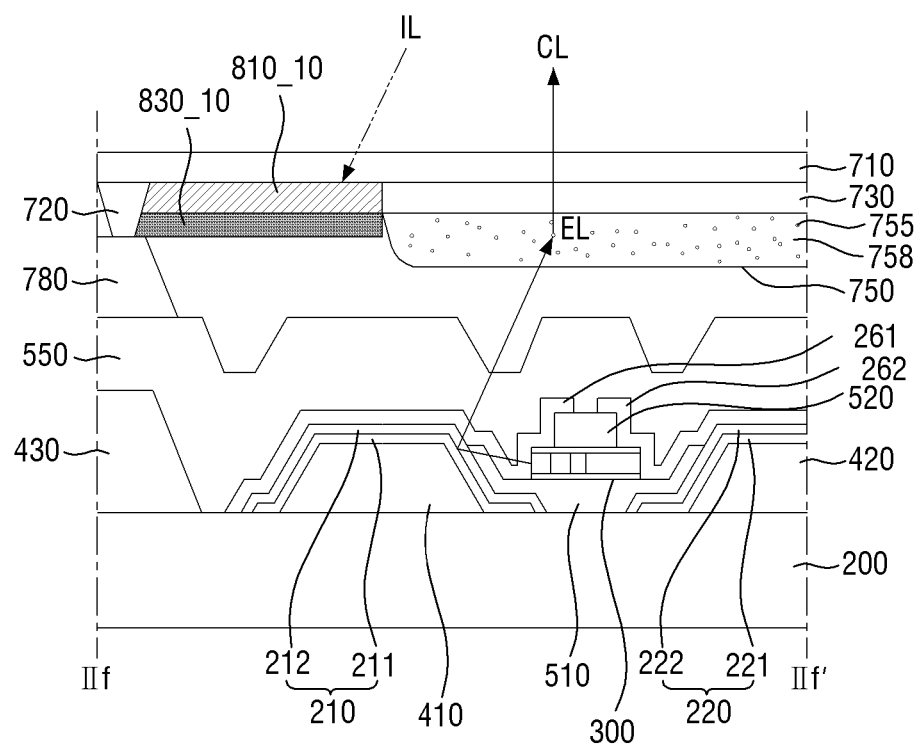
FIG. 33 is a schematic cross-sectional view taken along line IIf-IIf' of FIG. 31 according to yet another embodiment.

FIG. 33 is a schematic cross-sectional view taken along line of FIG. 31 according to an embodiment.

Referring to FIG. 33, a light-blocking layer 800_10 of a display device 10_10 according to the embodiment may further include a reflective portion 830_10. In case that light emitted from a light-emitting element 300 is incident on the reflective portion 830_10, the reflective portion 830_10 may reflect the incident light to an opening pattern 820 or the color conversion layer 750 of FIG. 31. Since the function and structure of the reflective portion 830_10 are the same as described above, detailed descriptions thereof will be omitted.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a first electrode and a second electrode that are spaced apart from and face each other;
a light-blocking layer disposed on the first electrode and the second electrode; and
at least one light-emitting element disposed between the first electrode and the second electrode, wherein
the light-blocking layer includes:
a light-blocking portion absorbing light; and
at least one opening pattern,
the light-blocking portion includes an area partially overlapping the first electrode and the second electrode,
the at least one opening pattern exposes portions of the first and second electrodes facing each other and exposes at least a portion of an area between the first and second electrodes facing each other, and
the at least one light-emitting element overlaps the at least one opening pattern.

2. The display device of claim 1, wherein
the light-blocking portion is disposed directly on upper surfaces of the first electrode and the second electrode,
the light-blocking portion includes a recessed area that is recessed from each of side surfaces of the first electrode and the second electrode, and
the at least one opening pattern is disposed in the recessed area of the light-blocking portion.

3. The display device of claim 2, wherein the light-blocking portion includes at least one selected from among chromium oxide ($CrO_x$), a chromium-chromium oxide ($Cr/CrO_x$) mixture, molybdenum oxide ($MoO_x$), a carbon pigment, and a trichromatic pigment of red-green-blue (RGB).

4. The display device of claim 1, further comprising a first insulating layer overlapping at least portions of the first electrode and the second electrode,
wherein the light-blocking layer is disposed on the first insulating layer.

5. The display device of claim 4, wherein
the at least one opening pattern includes a first opening pattern and a second opening pattern spaced apart from each other, and
a light-blocking portion bridge is disposed in a separation area between the first opening pattern and the second opening pattern.

6. The display device of claim 4, further comprising a contact electrode which is disposed on the first insulating layer and partially contacts the at least one light-emitting element,
wherein the contact electrode includes;
a first contact electrode electrically contacting the first electrode and an end portion of the at least one light-emitting element, and
a second contact electrode electrically contacting the second electrode and another end portion of the at least one light-emitting element.

7. The display device of claim 6, wherein the contact electrode includes at least a portion that overlaps the at least one opening pattern.

8. The display device of claim 7, wherein the at least a portion of the contact electrode partially overlaps the light-blocking portion.

9. The display device of claim 1, further comprising a second insulating layer overlapping the first electrode, the second electrode, and the at least one light-emitting element.

10. The display device of claim 9, wherein
the light-blocking layer is disposed on the second insulating layer, and
the at least one light-emitting element includes:
a first light-emitting element overlapping the at least one opening pattern; and
a second light-emitting element overlapping the light-blocking portion.

11. The display device of claim 10, wherein the light-blocking layer further includes a reflective portion disposed between the second insulating layer and the light-blocking portion.

12. The display device of claim 11, wherein
at least a portion of first light emitted from the first light-emitting element is emitted through the at least one opening pattern, and at least a portion of second light emitted from the second light-emitting element is reflected from the reflective portion toward the at least one opening pattern.

13. The display device of claim 9, further comprising a color conversion part disposed on the second insulating layer and converting a wavelength of light incident on the color conversion part, wherein
the light incident on the color conversion part is at least a portion of light emitted from the at least one light-emitting element, and
the light-blocking layer is further disposed on the color conversion part.

14. A display device comprising:
a first electrode and a second electrode which extend in a first direction and are spaced apart from each other;
a light-blocking layer disposed on the first electrode and the second electrode; and
at least one light-emitting element which is disposed between the first electrode and the second electrode and includes end portions that are electrically connected to the first electrode and the second electrode, respectively, wherein
the light-blocking layer includes:
a light-blocking portion absorbing light; and
at least one opening pattern including at least a portion that extends in the first direction,
at least a partial area of the light-blocking portion partially overlaps the first electrode and the second electrode,
the at least one opening pattern exposes portions of the first and second electrodes and exposes at least a portion of an area between the first and second electrodes, and
the at least one light-emitting element overlaps the at least one opening pattern.

15. The display device of claim 14, further comprising a first insulating layer overlapping, at least portions of the first electrode and the second electrode,
wherein the light-blocking layer is disposed on the first insulating layer.

16. The display device of claim 15, wherein the light-blocking portion includes at least one selected from among chromium oxide ($CrO_x$), a chromium-chromium oxide ($Cr/CrO_x$) mixture, molybdenum oxide ($MoO_x$), a carbon pigment, and a trichromatic pigment of red-green-blue (RGB).

17. The display device of claim 15, wherein
the at least one opening pattern includes a first opening pattern and a second opening pattern which extend in a first direction, and
the first opening pattern and the second opening pattern each have a width greater than an interval between the first electrode and the second electrode.

18. The display device of claim 17, wherein the light-blocking portion includes a light-blocking portion bridge disposed between the first opening pattern and the second opening pattern spaced apart from each other.

19. The display device of claim 18, wherein
the first opening pattern and the second opening pattern are spaced apart from each other in the first direction, and
the light-blocking portion bridge extends in a second direction different from the first direction.

20. The display device of claim 18, wherein
the first opening pattern and the second opening pattern are spaced apart from each other in a third direction different from the first direction, and
the light-blocking portion bridge extends in the first direction.

* * * * *